United States Patent
Kimizuka et al.

(10) Patent No.: US 12,001,521 B2
(45) Date of Patent: Jun. 4, 2024

(54) ADJUSTING METHOD OF CHARGED PARTICLE BEAM DEVICE AND CHARGED PARTICLE BEAM DEVICE SYSTEM

(71) Applicant: Hitachi High-Tech Corporation, Tokyo (JP)

(72) Inventors: Heita Kimizuka, Tokyo (JP); Natsuki Tsuno, Tokyo (JP); Muneyuki Fukuda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 575 days.

(21) Appl. No.: 17/285,368

(22) PCT Filed: Sep. 9, 2019

(86) PCT No.: PCT/JP2019/035369
§ 371 (c)(1),
(2) Date: Apr. 14, 2021

(87) PCT Pub. No.: WO2020/095531
PCT Pub. Date: May 14, 2020

(65) Prior Publication Data
US 2021/0327048 A1 Oct. 21, 2021

(30) Foreign Application Priority Data
Nov. 8, 2018 (JP) ................. 2018-210167

(51) Int. Cl.
*G06F 18/40* (2023.01)
*G06T 5/50* (2006.01)
(Continued)

(52) U.S. Cl.
CPC ............... *G06F 18/40* (2023.01); *G06T 5/50* (2013.01); *G06T 5/92* (2024.01); *G06T 7/0004* (2013.01);
(Continued)

(58) Field of Classification Search
CPC . G06F 18/40; G06T 5/009; G06T 5/50; G06T 7/0004; G06T 2207/10061;
(Continued)

(56) References Cited

U.S. PATENT DOCUMENTS 8,841,612 B2 9/2014 Fukuda et al.
9,324,540 B2 4/2016 Tachibana et al.
(Continued)

FOREIGN PATENT DOCUMENTS

EP 1 635 374 A1 3/2006
JP 2001-148230 A 5/2001
(Continued)

OTHER PUBLICATIONS

Japanese-language Office Action issued in Japanese Application No. 2020-556632 dated Jul. 5, 2022 with English translation (four (4) pages).

(Continued)

Primary Examiner — Michael Maskell
(74) Attorney, Agent, or Firm — Crowell & Moring LLP

(57) ABSTRACT

The present disclosure hereinafter proposes a charged particle beam device and a method for adjusting a charged particle beam device which aim to appropriately set device conditions independently of a state of a sample. The present disclosure proposes a method and a system for adjusting contrast and brightness of an image, comprising: adjusting offset (step 112) of a signal processing device of the charged particle beam device so that the brightness of a pattern in an image obtained by scanning with a first charged particle beam (first intermittent condition beam) becomes a predetermined value; and adjusting a gain (step 114) of the signal processing device so that the brightness of a pattern in an image obtained by scanning with a second charged particle beam, which is a pulse beam (second intermittent condition (Continued)

beam) different from the first charged particle beam in at least one of irradiation time, irradiation distance, interval time between irradiation points, and distance between irradiation points, becomes a predetermined value.

20 Claims, 27 Drawing Sheets

(51) Int. Cl.
*G06T 5/92* (2024.01)
*G06T 7/00* (2017.01)
*H01J 37/22* (2006.01)
*H01J 37/28* (2006.01)

(52) U.S. Cl.
CPC ............ *H01J 37/222* (2013.01); *H01J 37/28* (2013.01); *G06T 2207/10061* (2013.01); *G06T 2207/30148* (2013.01)

(58) Field of Classification Search
CPC .......... G06T 2207/30148; H01J 37/222; H01J 37/28; H01J 37/244; H01J 37/263; H01J 2237/2626; H01J 2237/2817; H01J 37/24; G06V 10/141; G06V 20/69
USPC .................................. 250/306, 307, 310, 311
See application file for complete search history.

(56) References Cited

U.S. PATENT DOCUMENTS

| | | | | |
|---|---|---|---|---|
| 2006/0065844 A1* | 3/2006 | Zelakiewicz | ............ | H04N 5/32 348/E5.042 |
| 2007/0187595 A1 | 8/2007 | Tanaka et al. | | |
| 2013/0126733 A1* | 5/2013 | Fukuda | ................ | H01J 37/263 250/310 |
| 2014/0092231 A1* | 4/2014 | Nakahira | ................ | H01J 37/28 348/80 |
| 2015/0041644 A1* | 2/2015 | Tsuno | ..................... | H01J 37/28 250/311 |
| 2015/0371819 A1* | 12/2015 | Li | ........................... | H01J 37/28 250/310 |
| 2016/0240348 A1 | 8/2016 | Yokosuka et al. | | |
| 2019/0051490 A1* | 2/2019 | Tsuno | .................. | G01N 23/225 |

FOREIGN PATENT DOCUMENTS

| | | | |
|---|---|---|---|
| JP | 2007-218711 A | | 8/2007 |
| JP | 2014-146615 A | | 8/2014 |
| JP | 2016-25048 A | | 2/2016 |
| JP | 6239633 B2 | | 11/2017 |
| JP | 2017-224553 A | | 12/2017 |
| TW | 201130010 A | | 9/2011 |
| WO | WO 2007/067310 A2 | | 6/2007 |
| WO | WO 2015/045498 A1 | | 4/2015 |
| WO | WO 2017/187548 A1 | | 11/2017 |
| WO | WO 2018/077471 A1 | | 5/2018 |

OTHER PUBLICATIONS

Korean-language Office Action issued in Korean Application No. 10-2021-7008375 dated Oct. 19, 2022 (five (5) pages).
International Search Report (PCT/ISA/210) issued in PCT Application No. PCT/JP2019/035369 dated Dec. 3, 2019 with English translation (five (5) pages).
Japanese-language Written Opinion (PCT/ISA/237) issued in PCT Application No. PCT/JP2019/035369 dated Dec. 3, 2019 (four (4) pages).
Japanese-language International Preliminary Report on Patentability (PCT/IPEA/409) with Annexes issued in PCT Application No. PCT/JP2019/035369 dated Oct. 26, 2020 (10 pages).
Taiwanese-language Office Action issued in Taiwanese Application No. 108140007 dated Aug. 5, 2020 (nine (9) pages).

\* cited by examiner

FIG.5
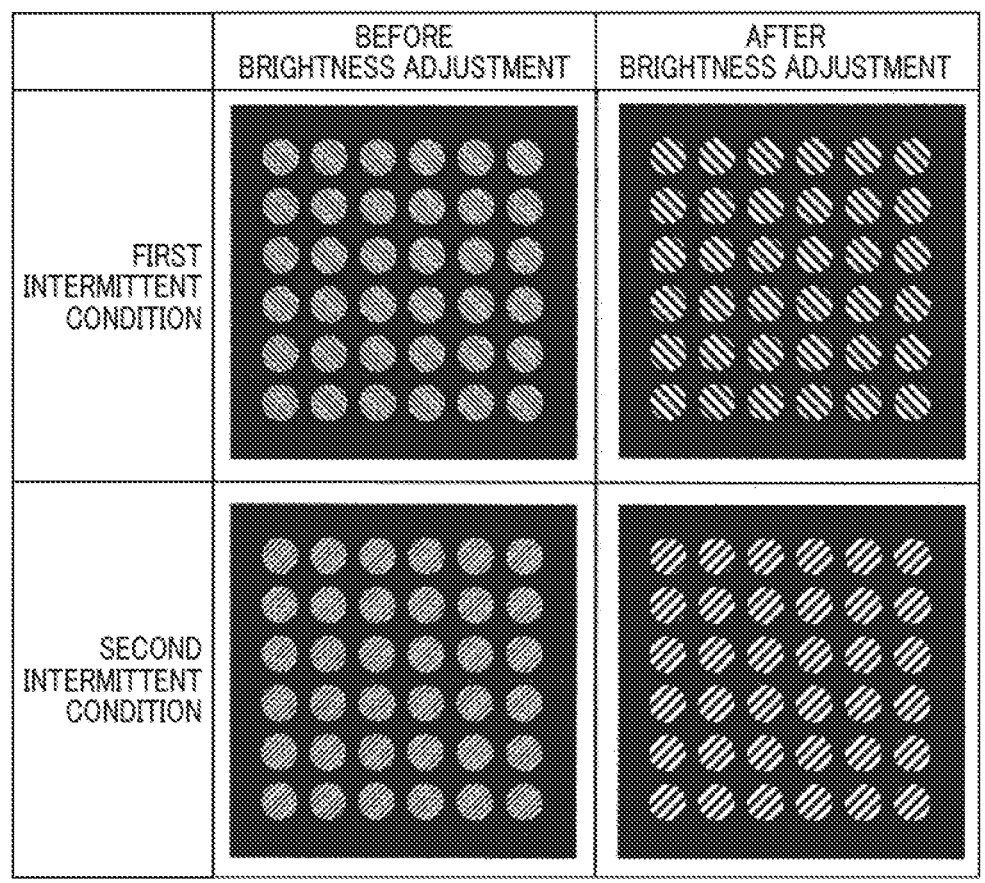
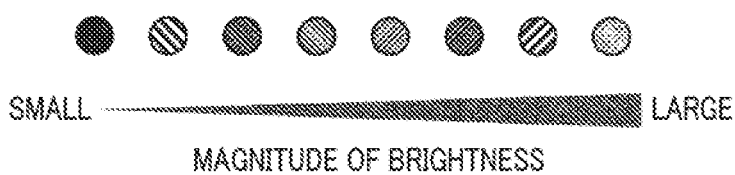

FIG.6
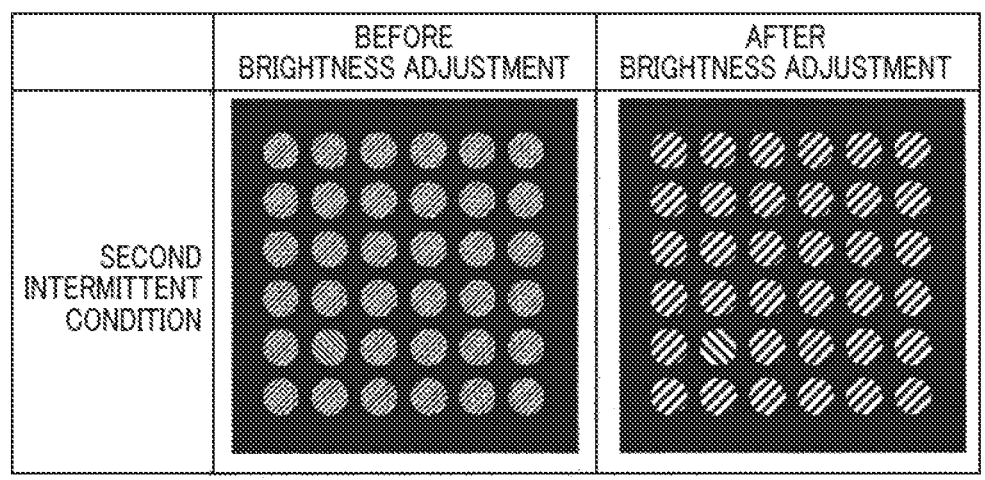
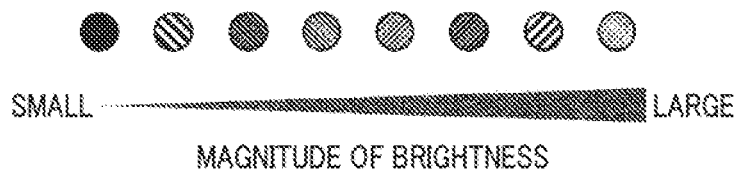
MAGNITUDE OF BRIGHTNESS

FIG.7
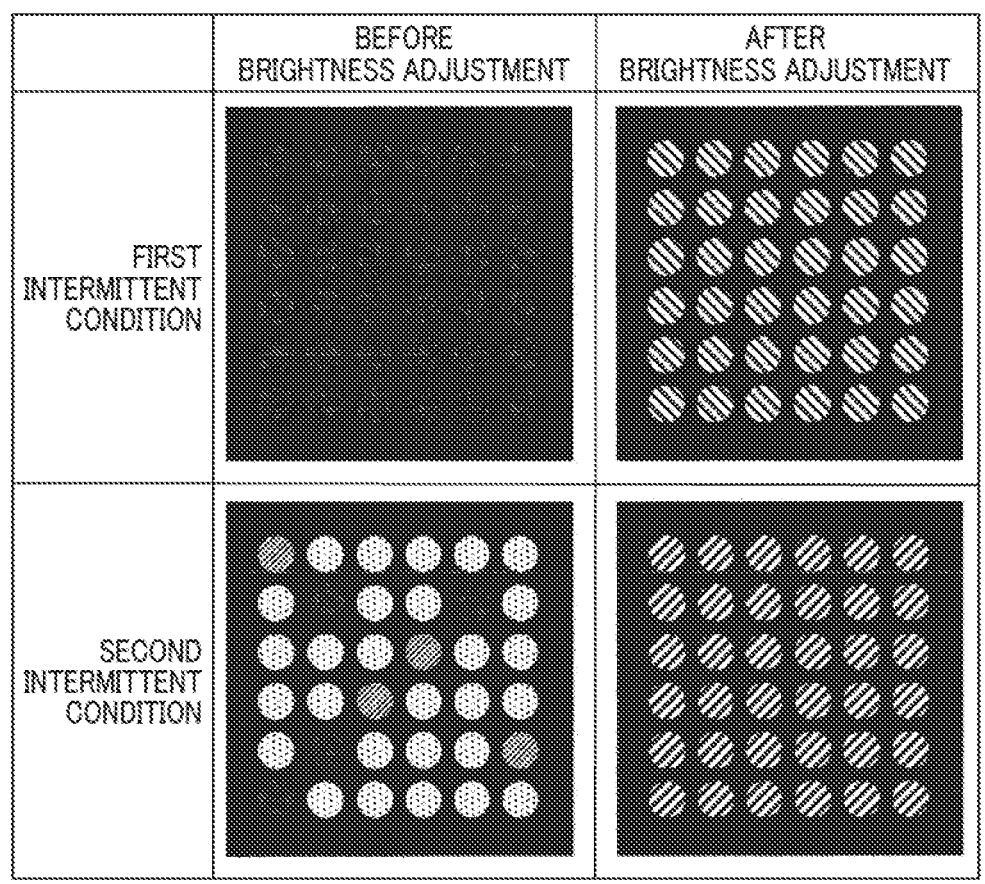
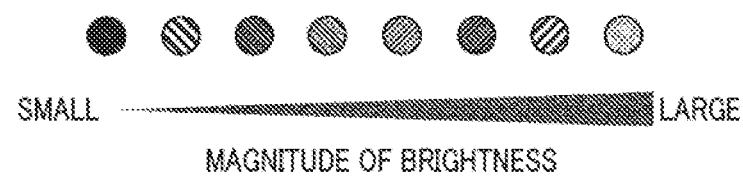
MAGNITUDE OF BRIGHTNESS

FIG.8
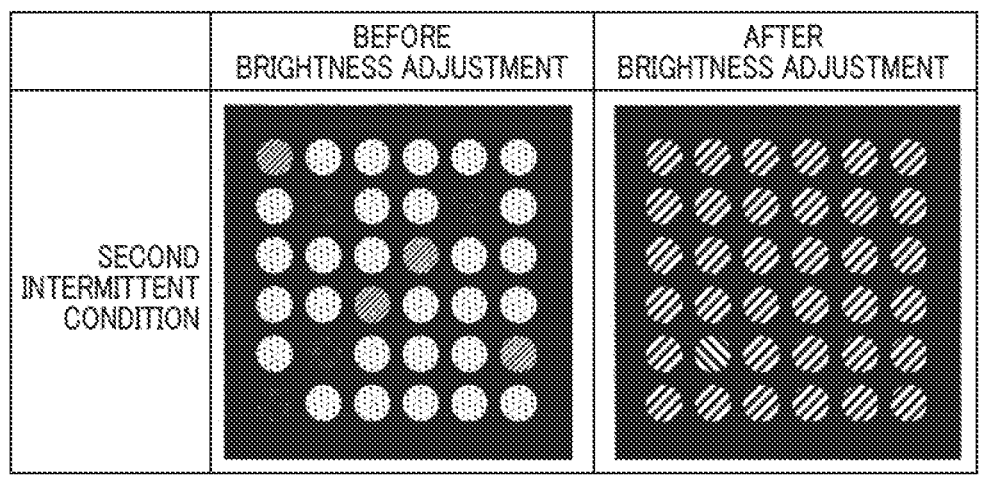
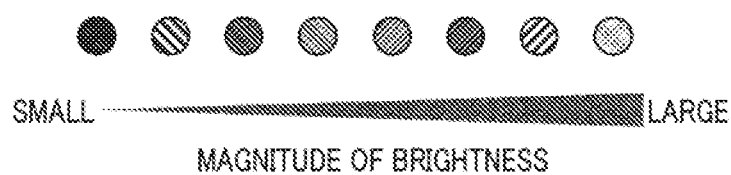
FIG.9
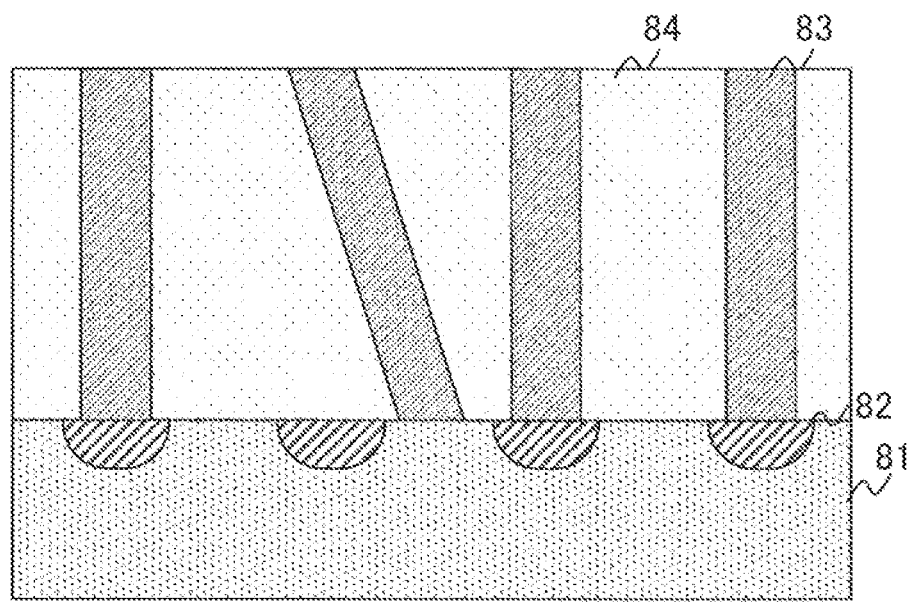

FIG.10
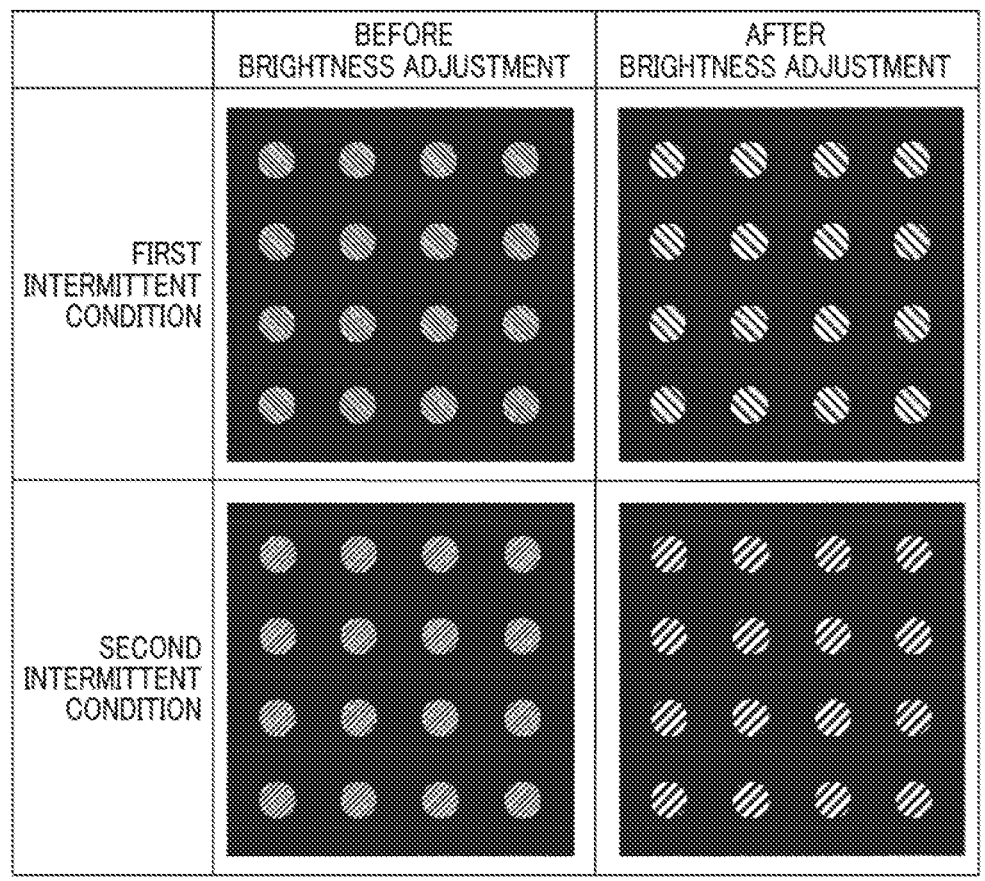
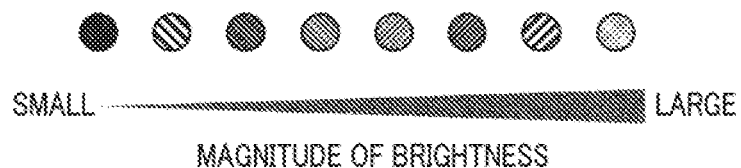

FIG.12
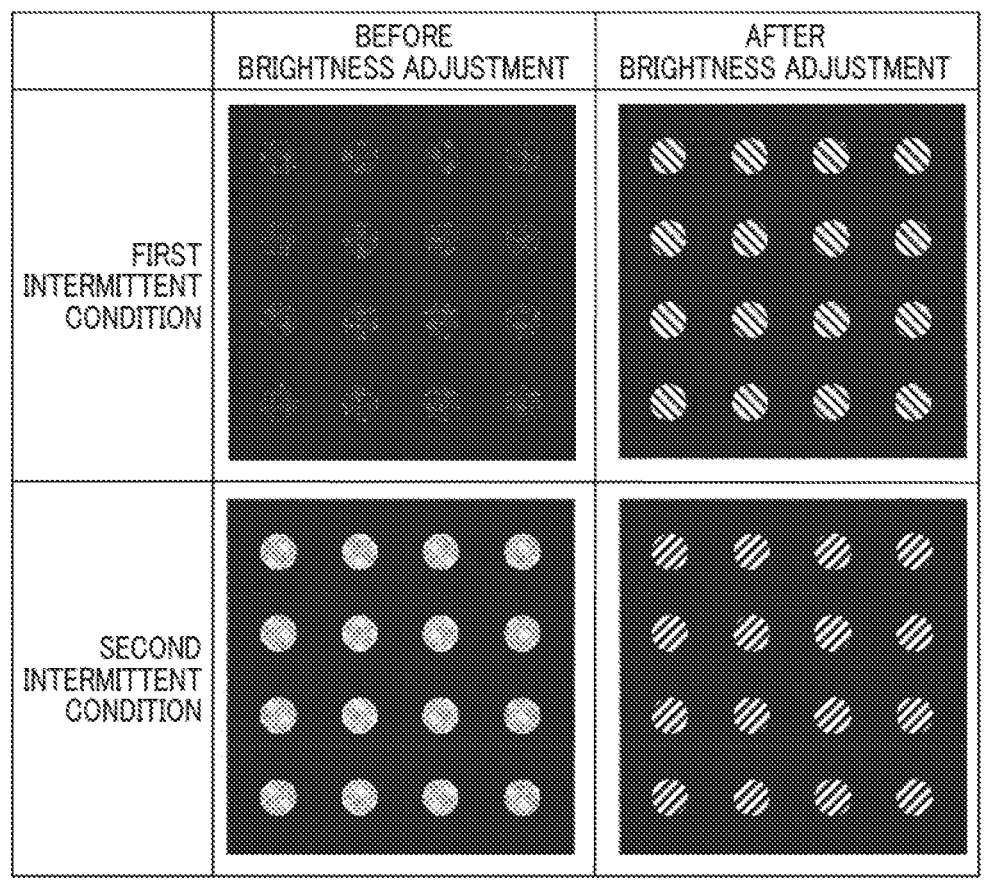
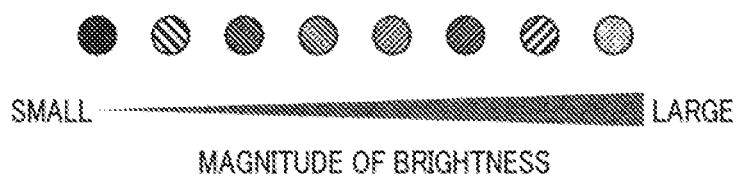
SMALL ──────────────── LARGE
MAGNITUDE OF BRIGHTNESS FIG.15
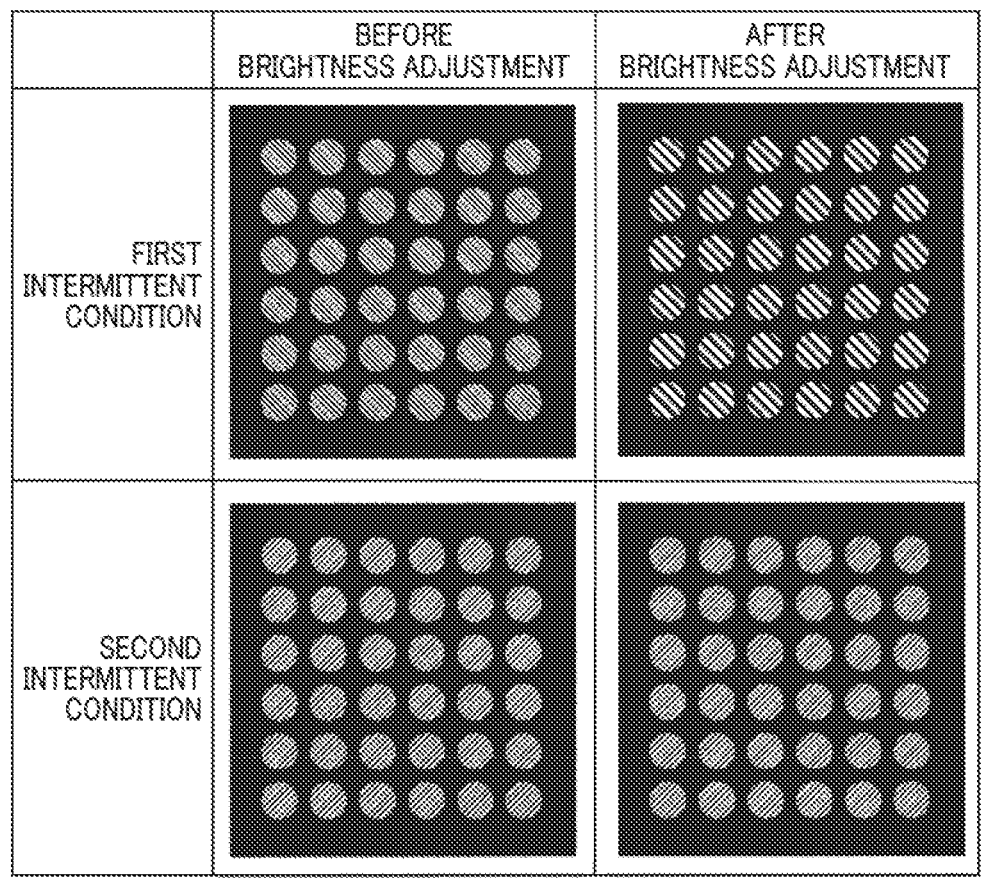
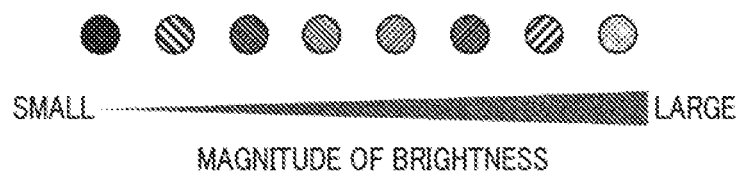
MAGNITUDE OF BRIGHTNESS FIG.16
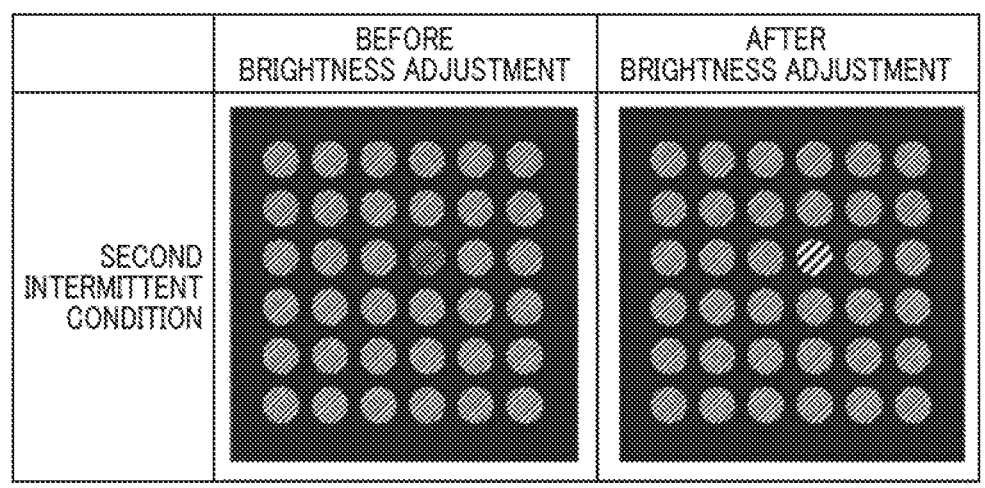
MAGNITUDE OF BRIGHTNESS

| | BEFORE BRIGHTNESS ADJUSTMENT | AFTER BRIGHTNESS ADJUSTMENT |
|---|---|---|
| FIRST INTERMITTENT CONDITION | | |
| SECOND INTERMITTENT CONDITION | | |

SMALL ←——————————→ LARGE
MAGNITUDE OF BRIGHTNESS

FIG.21
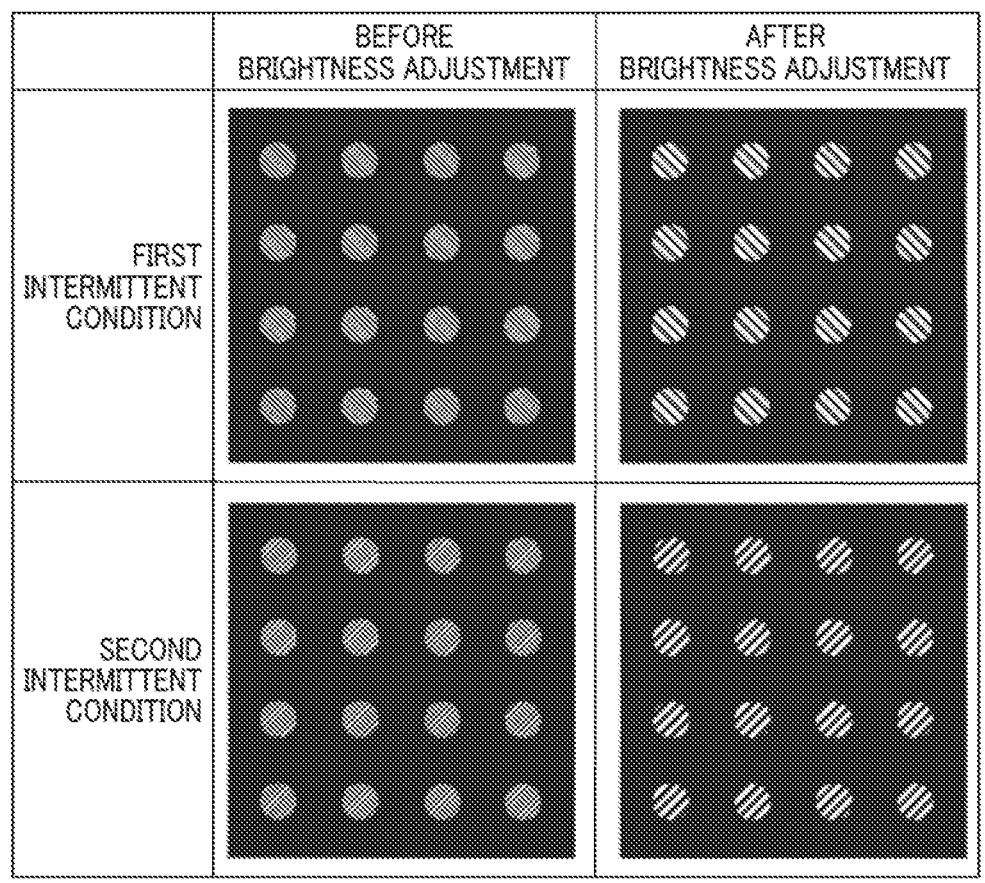
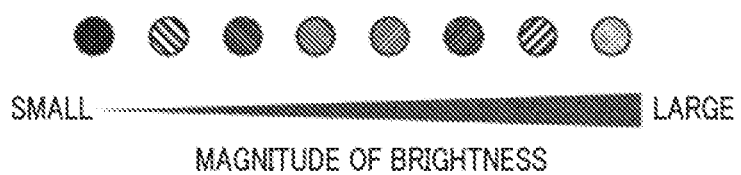

FIG.22

| | |
|---|---|
| FIRST INTERMITTENT CONDITION<br>IRRADIATION TIME: 20 μs<br>TIME BETWEEN IRRADIATION POINTS: 20 μs | |
| THIRD INTERMITTENT CONDITION<br>IRRADIATION TIME: 20 μs<br>TIME BETWEEN IRRADIATION POINTS: 40 μs | |
| FOURTH INTERMITTENT CONDITION<br>IRRADIATION TIME: 20 μs<br>TIME BETWEEN IRRADIATION POINTS: 60 μs | |
| FIFTH INTERMITTENT CONDITION<br>IRRADIATION TIME: 20 μs<br>TIME BETWEEN IRRADIATION POINTS: 80 μs | |
| SECOND INTERMITTENT CONDITION<br>IRRADIATION TIME: 20 μs<br>TIME BETWEEN IRRADIATION POINTS: 100 μs | |

FIG.25
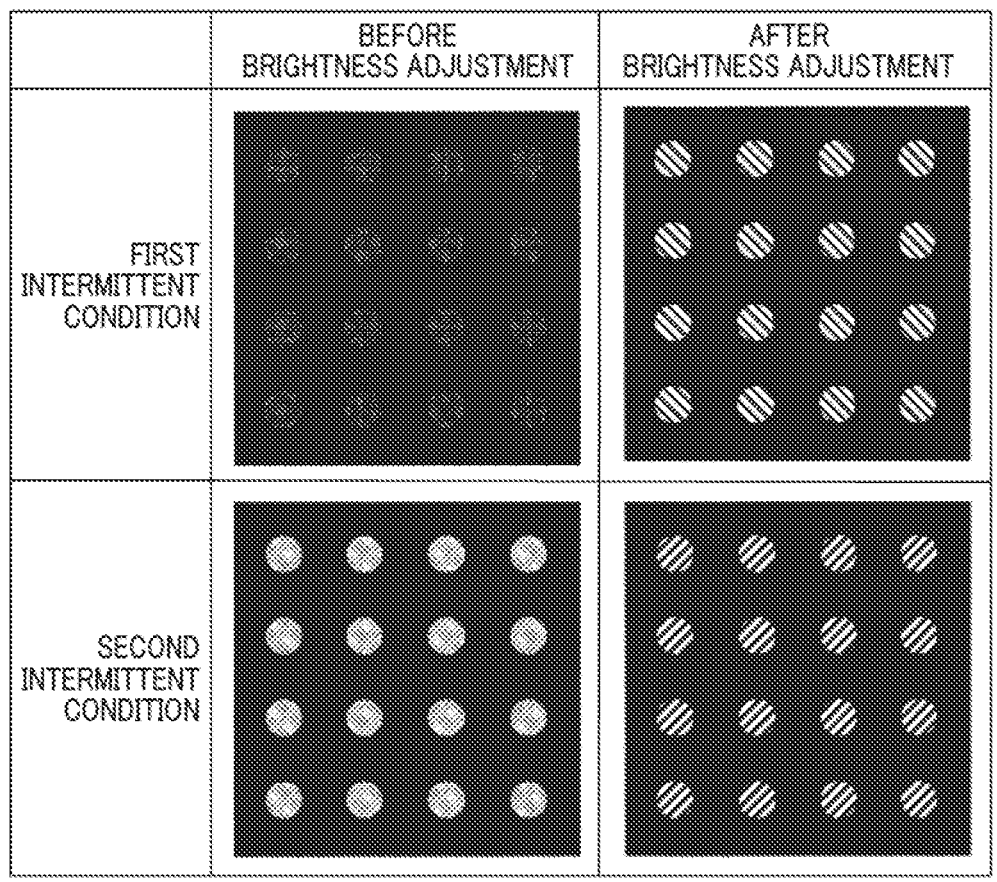
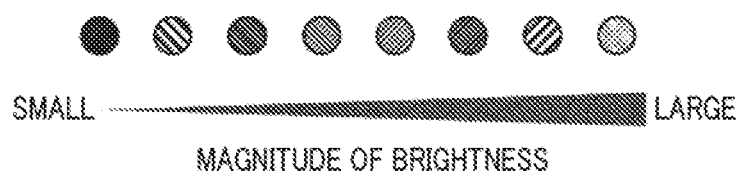
MAGNITUDE OF BRIGHTNESS

FIG.31

| | | |
|---|---|---|
| SCANNING SPEED | TV ▼ | ~56 |
| SCANNING AREA | 10 μm ▼ | ~57 |

| INTERMITTENT CONDITION 1 | INTERMITTENT CONDITION 2 | + |
|---|---|---|

~58

☑ USED FOR BRIGHTNESS ADJUSTMENT   ☑ SPECIFY AS INTERMITTENT CONDITION IN INSPECTION RECIPE

IRRADIATION TIME/IRRADIATION DISTANCE — TIME ▼ 1 μs ▼
INTERVAL TIME BETWEEN IRRADIATION POINTS/DISTANCE BETWEEN IRRADIATION POINTS — DISTANCE ▼ 1 μm ▼

~59

☑ AUTOMATIC BRIGHTNESS ADJUSTMENT (DEFAULT: ON) ~111

☑ AUTOMATIC INTERMITTENT CONDITION ADJUSTMENT ~112

INSPECTION STATUS ~113

| NO. | MEASUREMENT POSITION | STATUS |
|---|---|---|
| 1 | (1505.0, 1030.0) μm | END |
| 2 | (1525.0, 1020.0) μm | END |
| 3 | (1525.0, 1118.0) μm | END |
| 4 | (1530.0, 980.0) μm | UNDER INSPECTION |
| 5 | (1530.0, 1230.0) μm | NOT INSPECTED |
| 6 | (1680.0, 1030.0) μm | NOT INSPECTED |
| 7 | (1890.0, 990.0) μm | NOT INSPECTED |
| 8 | (2370.0, 2330.0) μm | NOT INSPECTED |
| 9 | (3780.0, 4330.0) μm | NOT INSPECTED |
| 10 | (3780.0, 4410.0) μm | NOT INSPECTED |

ADJUSTING METHOD OF CHARGED PARTICLE BEAM DEVICE AND CHARGED PARTICLE BEAM DEVICE SYSTEM

TECHNICAL FIELD

The present disclosure relates to a charged particle beam device which irradiates a sample with a charged particle beam and more particularly to a charged particle beam device which irradiates a sample with a pulsed charged particle beam.

BACKGROUND ART

A charged particle beam device, for example, a scanning electron microscope can identify a nanometer-order shape pattern and is used for inspection and measurement of semiconductor devices and the like. Particularly in defect inspection, a defect is extracted using the brightness difference of pattern images through a scanning electron microscope. Hereinafter, brightness denotes the degree of brightness of an image or pixel acquired by a charged particle beam device. Patent Literature 1 discloses a technique which emphasizes the brightness difference between a normal pattern and a defective pattern by controlling the electron irradiation dose and the waiting time between irradiations by pulsing an electron beam. Patent Literature 2 discloses a technique which automatically adjusts the contrast of an image using the signal intensity detected from a sample.

CITATION LIST

Patent Literature

Patent Literature 1:
WO 2017/187548
Patent Literature 2:
Japanese Patent Application Laid-Open No. 2001-148230

SUMMARY OF INVENTION

Technical Problem

The charged particle beam device includes an adjuster which adjusts an output signal from a detector. In order to make a defective pattern in an image apparent, it is necessary to set the adjuster appropriately, but it is difficult to set appropriate device conditions (for example, gain) for the defective pattern unless the defective pattern is in the visual field. Both Patent Literature 1 and Patent Literature 2 do not disclose a method for setting appropriate device conditions when the pattern expected to be apparent is not in the visual field.

Hereinafter, a method for adjusting a charged particle beam device and a charged particle beam device system which aim to appropriately set device conditions independently of the state of a sample are proposed.

Solution to Problem

As one aspect to achieve the above object, there is proposed a method for adjusting contrast and brightness of an image obtained by scanning a sample with a charged particle beam. The method comprises: adjusting offset of a signal processing device of a charged particle beam device so that brightness of a pattern in an image obtained by scanning with a first charged particle beam becomes a predetermined value; and adjusting a gain of the signal processing device so that the brightness of a pattern in an image obtained by scanning with a second charged particle beam, which is a pulse beam different from the first charged particle beam in at least one of irradiation time, irradiation distance, interval time between irradiation points, and distance between irradiation points, becomes a predetermined value.

As another aspect to achieve the above object, there is proposed a method for adjusting contrast and brightness of an image obtained by scanning a sample with a charged particle beam. The method comprises the steps of: scanning the sample with a first condition beam; scanning the sample with a beam of a second condition different from the first condition; evaluating a characteristic of an image obtained by scanning with the first condition beam; evaluating a characteristic of an image obtained by scanning with the second condition beam; adjusting a signal processing device of a charged particle beam device so that the characteristic of the image obtained by scanning with the first condition beam becomes in a predetermined state; and adjusting the signal processing device so that the characteristic of the image obtained by scanning with the second condition beam becomes in a predetermined state.

As a further other aspect to achieve the above object, there is proposed a system which comprises: a charged particle beam device including a deflector structured to scan a charged particle beam emitted from a charged particle source and a detector structured to detect charged particles obtained by scanning a sample with the charged particle beam; and a controller connected to the charged particle beam device. The controller is structured to evaluate characteristics of a first image and a second image which are obtained by beam scanning under different beam conditions and control the signal processing device so that the characteristic of the first image and the characteristic of the second image satisfy predetermined conditions.

Advantageous Effects of Invention

According to the above aspects, it is possible to set appropriate device conditions independently of the state of a sample.

BRIEF DESCRIPTION OF DRAWINGS

FIG. 5 shows an example of scanning electron microscope images.
FIG. 6 shows an example of scanning electron microscope images.
FIG. 7 shows an example of scanning electron microscope images.
FIG. 8 shows an example of scanning electron microscope images.
FIG. 9 shows the cross-section structure of a sample in the second embodiment.
FIG. 10 shows an example of scanning electron microscope images.

FIG. 12 shows an example of scanning electron microscope images.

FIG. 15 shows an example of scanning electron microscope images.

FIG. 16 shows an example of scanning electron microscope images.

FIG. 21 shows an example of scanning electron microscope images.

FIG. 22 shows an example of scanning electron microscope images.

FIG. 25 shows an example of scanning electron microscope images.

FIG. 31 shows an example of an operation interface.

DESCRIPTION OF EMBODIMENTS

Figure 1:
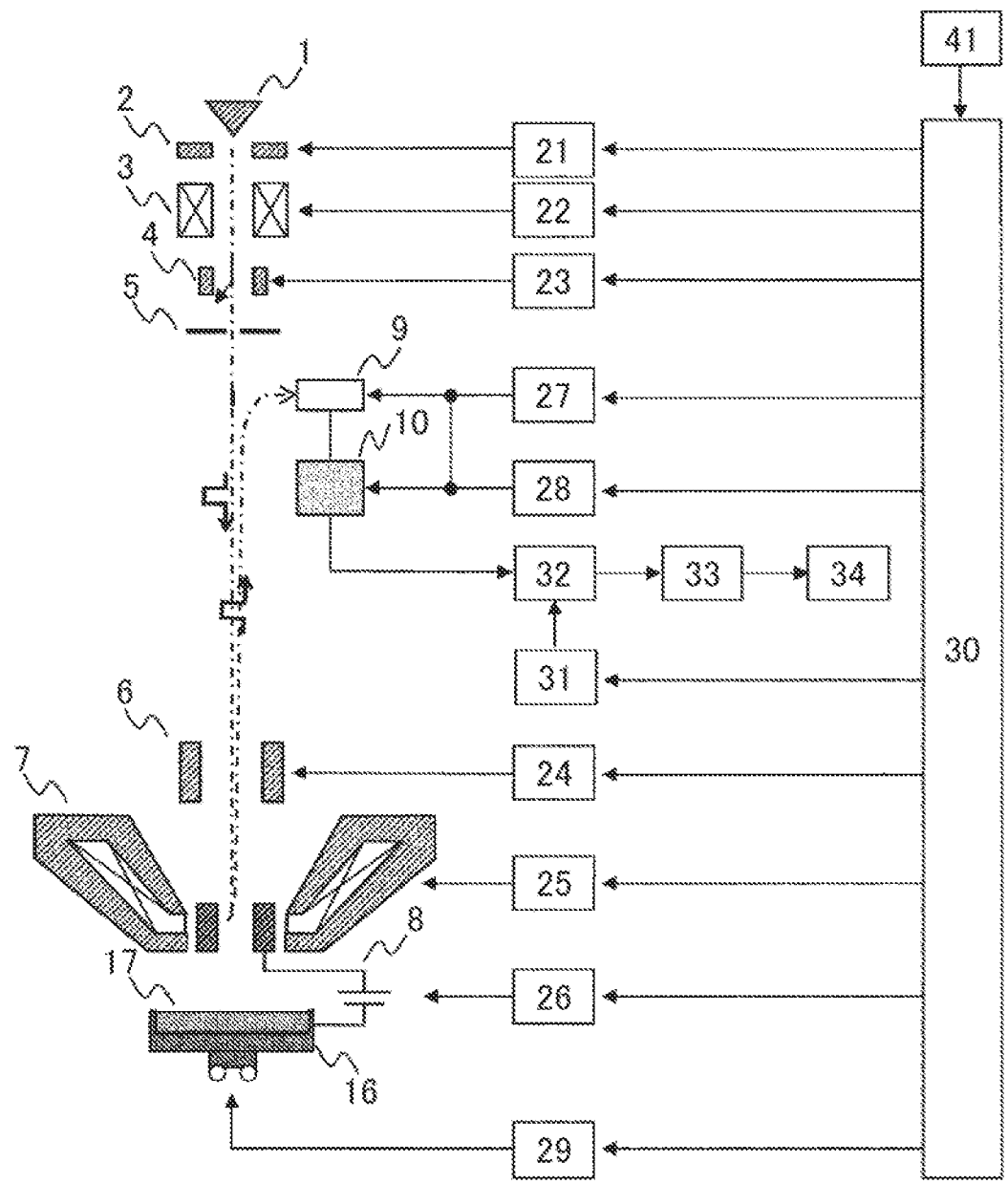
FIG. 1 shows an example of a scanning electron microscope.

For example, when inspection of a semiconductor device pattern is conducted through a scanning electron microscope, discrimination between a normal pattern and a defective pattern may be made from the difference in the amount of characteristic (for example, brightness) between the normal pattern and defective pattern. When the brightness difference between the normal pattern and defective pattern is larger, the defective pattern detection sensitivity is higher.

On the other hand, if the input/output gain in the signal detection system mounted in the electron microscope or the gain in analog-digital conversion of a signal in the image processing system is set to a large level, the signal intensity difference would be large and the image brightness difference between the normal pattern and defective pattern would be large. However, if gain is set to too large a level, the sensitivity to noise such as shot noise or circuit noise would also become higher, which might result in an increase in misinformation rate (probability of mistakenly judging a normal pattern as a defective pattern).

In order to improve the defective pattern detection sensitivity and reduce the misinformation rate, it may be desirable to control the signal detection system and the image processing system and adjust the image brightness so that the signal intensities of a normal pattern and a defective pattern are within the range of sensitivity of the detector and within the display range of image brightness of all gradation levels. For example, the signal processing system and image processing system are adjusted so that on a brightness histogram, the first brightness corresponding to the signal intensity of the defective pattern and the second brightness corresponding to the signal intensity of the normal pattern are close to the minimum gradation level and maximum gradation level respectively and the center is positioned in the center of all gradation levels.

For example, when adjusting the brightness of an image, if the image in the area for adjustment contains both a normal pattern and a defective pattern, the signal detection sensitivity of the detector and the display range of image brightness of all gradation levels can be determined according to the difference in signal intensity between the normal pattern and defective pattern.

However, if the image only contains a normal pattern, it is difficult to appropriately set device conditions because the signal intensity of a defective pattern is unknown.

Hereinafter, an explanation is made of a device condition adjusting method and a charged particle beam device which achieve both high sensitivity detection of defective patterns and reduction in misinformation rate.

The embodiment mentioned below proposes a charged particle beam device system which, for example, includes: a deflector structured to scan a charged particle beam emitted from a charged particle source; a detector structured to detect charged particles obtained by scanning a sample with the charged particle beam; an adjuster structured to adjust at least one of an output signal of the detector and an image signal generated from the output signal; and a controller structured to control the adjuster. The controller is structured to control the signal processing device so that the characteristics extracted from a first image and a second image which are obtained by beam scanning under different beam conditions satisfy prescribed conditions.

More specifically, for example, there is provided a charged particle beam device which has an intermittent irradiation system to pulse a charged particle beam emitted from a charged particle source and includes: a charged particle beam optical system which irradiates a sample in a focused manner while scanning with the pulsed charged particle beam; a secondary charged particle detection system which detects secondary charged particles emitted from the sample or secondary charged particles (tertiary electrons) generated by the secondary charged particles colliding another member (for example, secondary electron conversion electrode), from the other member; an image processing system which generates an image with brightness depending on the intensity of the detection signal of the secondary charged particles; and a controller which controls the intermittent irradiation system, the charged particle optical system, the secondary charged particle detection system, and the image processing system. The controller controls the secondary charged particle detection system or the image processing system so that the analysis value of the plural images or the analysis value of plural detection signals which are obtained with a plurality of intermittent conditions for the charged particle beam is within a predetermined range. The controller controls the charged particle beam optical system so as to acquire a plurality of images obtained by scanning with a charged particle beam while changing at least one of irradiation time, irradiation distance, interval time between irradiation points, and distance between irradiation points. The secondary charged particle detection system includes: a detector which detects the secondary charged particles obtained by irradiating the sample with the charged particle beam; and a signal intensity adjusting circuit which adjusts the intensity of a detection signal from the detector. The signal intensity adjusting circuit adjusts input/output gain of a signal so that the brightness difference of images obtained by charged particle beam scanning under different conditions in interval time between irradiations is within a predetermined range, and performs signal offset adjustment so that the image obtained by the gain-adjusted charged particle beam scanning under different conditions in the interval time between irradiations is within a predetermined range.

According to the above aspect, even if the inspection patterns of an image only include normal patterns, the sensitivity range of the detector in the charged particle beam optical system and the display range of image brightness of all gradation levels can be adjusted so that the signal intensities of the normal pattern and defective pattern are within the sensitivity range of the detector and within the display range of image brightness of all gradation levels, and thus the defect detection sensitivity can be improved and the misinformation rate can be reduced.

Next, an explanation will be made of a charged particle beam device which forms a magnified image of a sample according to a signal obtained by irradiating a charged particle beam. Among charged particle beam devices, a scanning electron microscope which scans an electron beam on the sample is a device which can obtain a high-resolution image. The scanning electron microscope is a device which focuses and scans the electron beam emitted from an electron source by applying an electromagnetic field, on a sample and detects the electrons emitted from the sample by irradiation of the electron beam through the detector to form an image. Since the number of detected electrons reflects the information of the sample, a contrasty image can be formed by scanning an electron beam.

In the embodiment mentioned below, an explanation is made of a charged particle beam device which, for example, includes: means to focus a charged particle beam emitted from a charged particle source; means to pulse-irradiate the charged particle beam intermittently; means to control the irradiation position of the charged particle beam; means to control irradiation time as time to irradiate the charged particle beam continuously; means to control irradiation distance as distance to scan during the irradiation time; means to control interval time between irradiation points as time between irradiations with the charged particle beam; means to control distance between irradiation points as distance interval between irradiation points to scan during the interval time between irradiation points; means to detect the charged particles obtained by irradiating the sample with the charged particle beam; means to adjust the input/output gain of the detection means; means to adjust offset of an output signal of the detection means; means to convert the intensity of the output signal into brightness of an image; means to adjust the conversion gain in conversion of the intensity of the output signal into image brightness or the offset of the converted brightness value; and means to display the image according to the converted brightness value and irradiation position information; and means to display the image. The charged particle beam device further includes: means to determine the brightness of a selected inspection pattern in the image; means to determine the brightness of a plurality of images obtained by charged particle beam scanning under a plurality of conditions which are different in the irradiation time or the irradiation distance, or the interval time between irradiation points, or the distance between irradiation points, and brightness difference between images; and means to perform gain adjustment of the detection means and output offset adjustment so that the brightness of the plural images and the brightness difference between images become predetermined values.

The charged particle beam device can adjust the brightness of an image by determining the dynamic range of the detector as the range of signal detection sensitivity using the images obtained by charged particle beam scanning under a plurality of different intermittent conditions so that the defective pattern detection sensitivity is improved and the increase in misinformation rate is suppressed.

A pulse beam is a beam which is irradiated intermittently by repeating irradiation and non-irradiation. Next, referring to drawings, an explanation will be made of a method for setting irradiation time, irradiation distance, interval time between irradiation points, and distance between irradiation points for a pulse beam and of a charged particle beam device which carries out a method for setting the dynamic range of the detector. In the explanation below, a scanning electron microscope which irradiates an electron beam on a sample and detects secondary electrons to generate an image is taken as one example of the charged particle beam device which irradiates a charged particle beam on a sample and detects secondary charged particles to generate an image. However, the invention is not limited thereto and can be applied, for example, to an ion beam device which irradiates an ion beam on a sample and detects secondary ions to generate an image.

First Embodiment

This embodiment concerns an inspection device which identifies a defective spot from brightness difference in a scanning electron microscope image and describes a scanning electron microscope which adjusts the brightness of an image so that the detection sensitivity of a defective pattern with small brightness is improved and the increase in misinformation rate is suppressed even if the area used to adjust the image brightness only contains normal patterns.

FIG. 1 shows an example of a scanning electron microscope in this embodiment. The scanning electron microscope includes an intermittent irradiation system, an electron optical system, a secondary electron detection system, a stage mechanism system, an image processing system, a control system, and an operation system. The intermittent irradiation system includes an electron beam source 1 and a pulse electron generator 4. Although the pulse electron generator 4 is separately provided in this embodiment, an electron beam source capable of irradiating pulse electrons may be used.

The electron optical system includes an acceleration voltage controller 2, a collecting lens 3, a diaphragm 5, a deflector 6, an objective lens 7, and a sample electric-field controller 8. The deflector 6 is provided to scan an electron beam on a sample one-dimensionally or two-dimensionally and is an object to be controlled as will be described later.

The secondary electron detection system includes a detector 9 and an output adjusting circuit 10. The stage mechanism system includes a sample stage 16 and a sample 17. The control system (controller) includes an acceleration voltage control section 21, an irradiation current control section 22, a pulse irradiation control section 23, a deflection control section 24, a focusing control section 25, a sample electric-field control section 26, a gain control section 27, an offset control section 28, a stage position control section 29, a control command section 30, and an analog-digital conversion control section 31. The control command section 30 writes a control value in each control section to perform control according to input information received from an operation interface 41. The operation interface 41 is displayed on a display device of a computer system or the like which is provided as an input device and the controller controls the secondary electron detection system and the like according to input through the operation interface.

The controller includes at least one processor structured to execute an adequate program command to cause at least one processor to carry out steps which will be described later. For example, at least one processor included in the controller is structured to be able to communicate with a storage medium containing a program command to cause at least one processor of the controller to perform processing which will be described later.

Here, the pulse irradiation control section 23 is structured to be able to generate a plurality of different beam conditions and controls irradiation time as time to irradiate an electron beam continuously, or irradiation distance as distance to irradiate an electron beam continuously, or interval time between irradiation points as interval time between electron beam irradiation times, or distance between irradiation points as distance interval between electron beam irradiation distances.

The image processing system includes a detection signal processing section 32, an image forming section 33, and an image display section 34. The detection signal processing section 32 and image forming section 33 in the image processing system include at least one processor and perform calculation of brightness of a specified inspection pattern or calculation of brightness difference between a plurality of inspection patterns or the like. The control values for the gain control section 27 and offset control section 28 are adjusted so that the obtained calculated value is the desired set brightness value. Brightness is a value which depends on the quantity of electrons emitted from a spot corresponding to a pixel in an image. When the quantity of electrons emitted from a sample is larger, brightness is larger.

Furthermore, in this embodiment, an explanation is made of a method for performing gain adjustment and offset adjustment (or adjusting circuit (adjuster)). However, gain adjustment and offset adjustment may be performed using, instead of brightness, an analysis value of brightness, for example, a brightness histogram of all pixels in an inspection pattern or the like, or adjustment may be performed using an adjuster for performing gain adjustment and offset adjustment according to a detection signal such as detected signal voltage, instead of brightness. In addition, this embodiment describes a method for performing brightness adjustment by a circuit (adjuster) which performs superimposition of I/V conversion gain and analog offset of an analog detection signal output from the detector 9. However, for example, when assigning a detected 16-bit analog signal to an 8-bit digital signal, an adjuster for digital adjustment which adjusts the image signal range and offset using the analog-digital conversion control section 31 may be used. Also, both the output signal and image signal may be adjusted. The signal processing device including an adjuster which performs gain adjustment and offset adjustment as mentioned above may be not just a module of the scanning electron microscope but may be constituted by at least one computer system which can receive detector output and supply a control signal to the scanning electron microscope. The operation system is constituted by the operation interface 41.

In addition, the controller may be defined as part of a system in which the scanning electron microscope is a sub system. The controller is connected to at least one portion of the scanning electron microscope in a communicable manner. Furthermore, the controller can control the scanning electron microscope according to the brightness information, etc. included in an image which is obtained by the detection system. Particularly, the controller adjusts the control parameter for at least one of the detection system and image processing system. Furthermore, the controller controls the stage or the deflector for moving the visual field so that a beam is irradiated on a predetermined position for the above adjustment, and also controls the electron optical system to irradiate a beam with a condition which will be described later.

Figure 2:
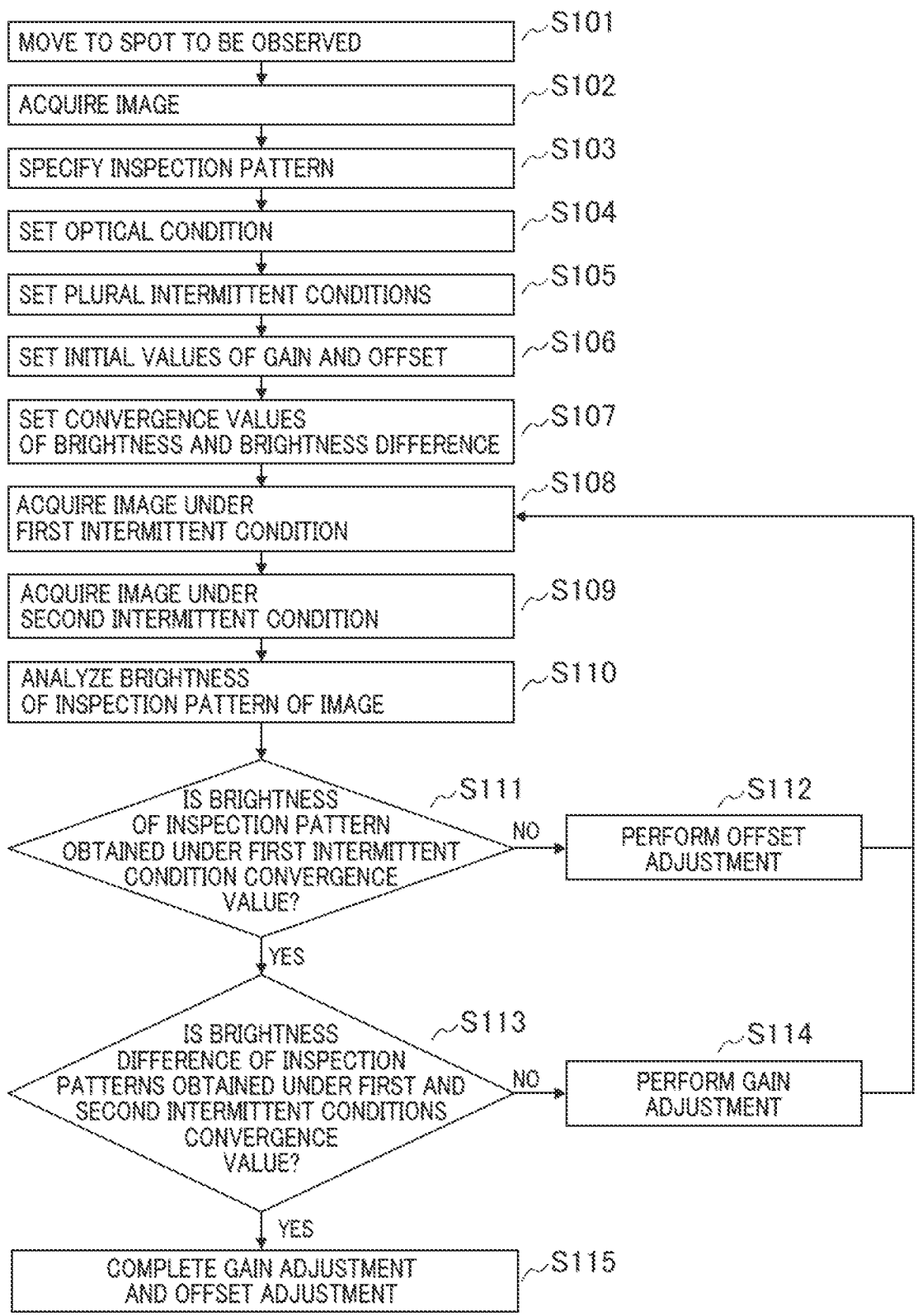
FIG. 2 is a flowchart which shows the process of performing gain adjustment and offset adjustment.

FIG. 2 shows a flowchart which shows the process of performing gain adjustment and offset adjustment in this embodiment. First, movement to the spot to be observed is made (S101). Then, an image is acquired (S102). Then, an inspection pattern is specified from the acquired image (S103). In this embodiment, the operator specifies an inspection pattern area, but the scanning electron microscope may automatically extract an inspection pattern according to the brightness of the image.

Then, the optical condition is set (S104). Here, the optical condition includes electron beam irradiation voltage, electron beam irradiation current, and sample electric field. Then, a plurality of intermittent conditions are set (S105). The plural intermittent conditions which are set at S105 are mutually different in at least one of irradiation time, irradiation distance, interval time between irradiation points, and distance between irradiation points. In this embodiment, a plurality of images which are different in image characteristics (for example, a first image and a second image) are generated by setting a plurality of intermittent conditions (beam conditions).

Then, initial values of gain and offset are set (S106). S106 is omissible. The set gain value and offset are set in the detector 9 and output adjusting circuit 10 through the gain control section 27 and offset control section 28. Then, among the inspection patterns of a plurality of images obtained using a plurality of intermittent conditions, the convergence value of brightness of the inspection pattern obtained under the first intermittent condition and the convergence value of brightness difference between the inspection patterns obtained under the first intermittent condition and second intermittent condition are set (S107). Then, an image is acquired under the first intermittent condition (S108). Then, an image is acquired under the second intermittent condition (S109). Then, the brightness of the inspection patterns of the images acquired under the two intermittent conditions is analyzed (S110). Then, a decision is made as to whether or not the analysis result of the brightness of the inspection pattern obtained under the first intermittent condition is the convergence value (S111). If it is not the convergence value, offset adjustment is performed (S112) and the process goes to S108 and steps from S108 to S110 are repeated. If it is the convergence value, the process goes to S113. Then, a decision is made as to whether or not the brightness difference between the inspection patterns obtained under the first intermittent condition and second intermittent condition is the convergence value (S113). If it is not the convergence value, gain adjustment is performed (S114) and the process goes to S108 and steps from S108 to S110 are repeated. If it is the convergence value, the process goes to S115. Then, gain adjustment and offset adjustment are completed (S115). The process illustrated in FIG. 2 may be manually performed or automatically performed under the control by the controller by preparing a program command for automatic execution.

Figure 3:
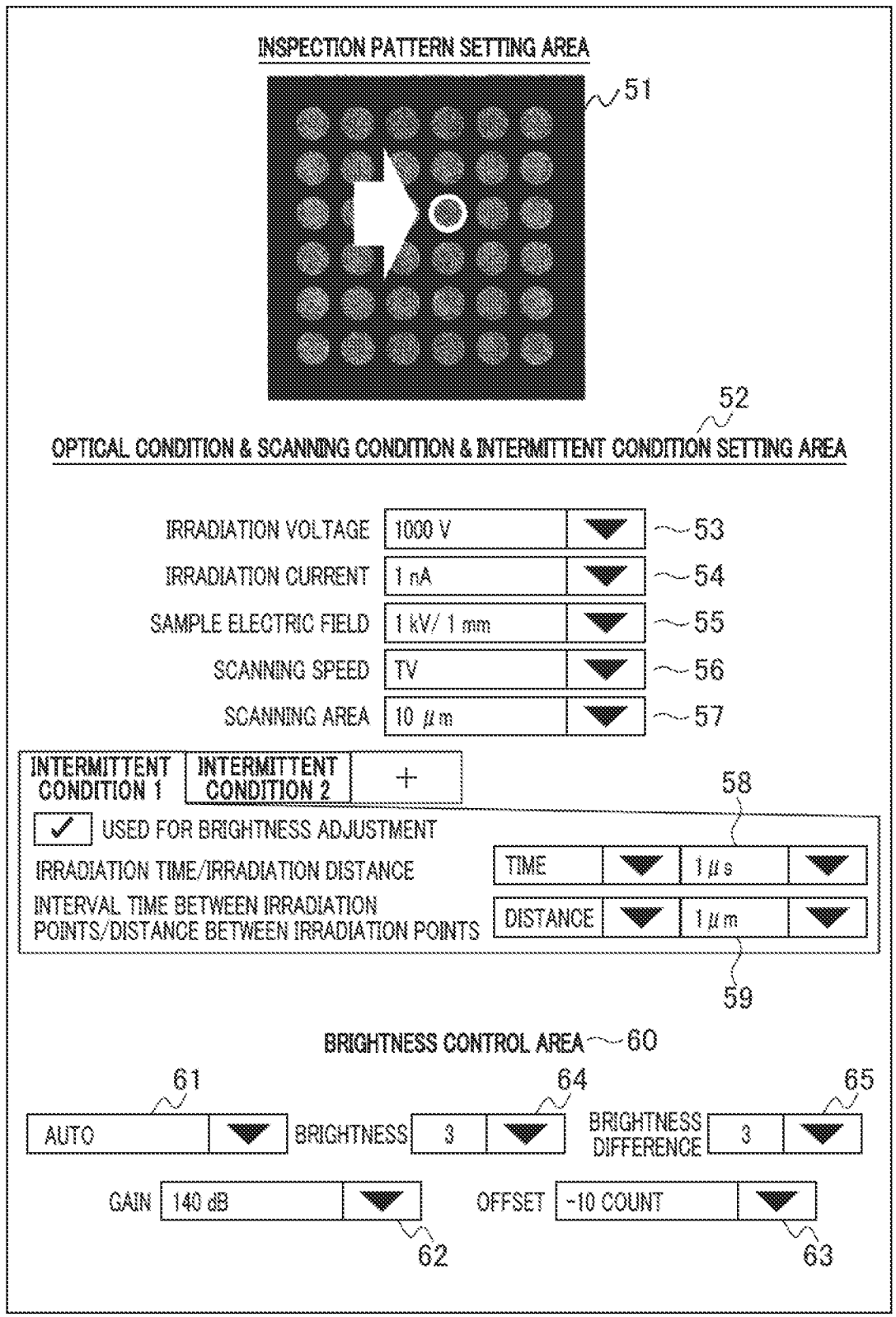
FIG. 3 shows an example of an operation interface.

FIG. 3 shows the operation interface which was used in this embodiment. The operation interface has an inspection pattern setting area 51 which displays an inspection image to specify an inspection pattern from the inspection image. It also has an optical condition & scanning condition & intermittent condition setting area 52 and has an irradiation voltage setting field 53, an irradiation current setting field 54, a sample electric field setting field 55, a scanning speed setting field 56, and a scanning area setting field 57. Furthermore, the optical condition & scanning condition & intermittent condition setting area 52 has an irradiation setting field 58 for setting irradiation time or irradiation distance, and an inter-irradiation point setting field 59 for setting interval time between irradiation points or distance between irradiation points.

For the plural intermittent conditions which are set in the flowchart of FIG. 2, settings in one or both of the irradiation setting field 58 and the inter-irradiation point setting field 59 are mutually different. The operation interface also has a brightness control area 60 for setting the initial values of gain and offset and the convergence values of brightness and brightness difference. Here, a value which represents a specific range is acceptable as a convergence value.

The brightness control area 60 has a manual/auto changeover field 61, a gain input/display field 62, an offset input/display field 63, a brightness setting field 64, and a brightness difference setting field 65. In gain adjustment and offset adjustment in this embodiment, the manual/auto changeover field 61 is set to Auto; a gain initial value is set in the gain input/display field 62; an offset initial value is set in the offset input/display field 63; a convergence value of brightness of the inspection pattern obtained under the first intermittent condition is set in the brightness setting field 64; and a convergence value of brightness difference between the inspection patterns obtained under the first intermittent condition and second intermittent condition is set in the brightness difference setting field 65. If the manual/auto changeover field 61 is set to Manual in the brightness control area 60, gain and offset can be manually controlled through the gain input/display field 62 and the offset input/display field 63.

Figure 4:
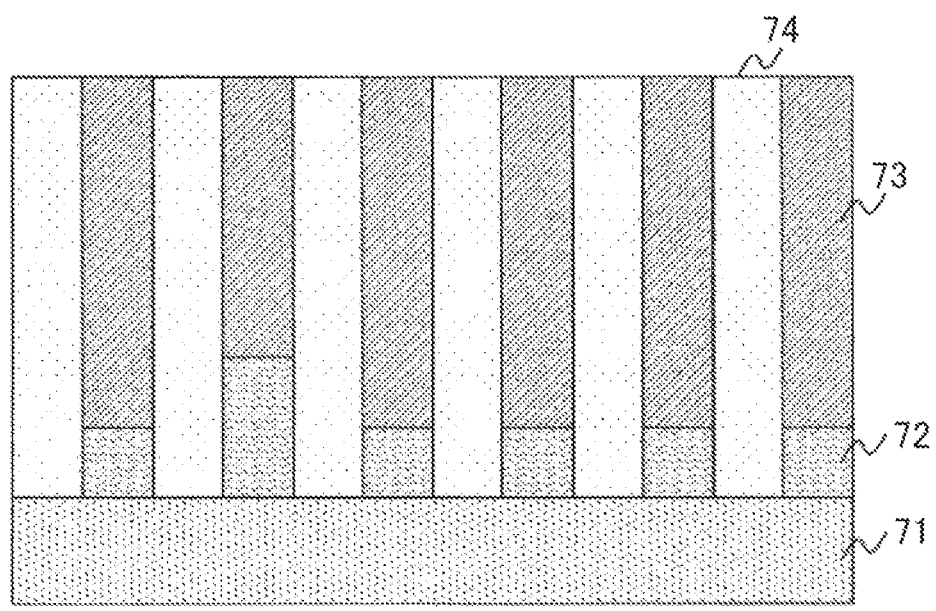
FIG. 4 shows the cross-section structure of a sample in the first embodiment.

Next, defect inspection using a scanning electron microscope for which gain adjustment and offset adjustment have been performed will be summarized. FIG. 4 is a sectional view of part of the sample used in this embodiment. In the sample illustrated in FIG. 4, a lamination with a bottom insulating film 72 and a contact plug 73 stacked, and an interlayer insulating film 74 are stacked over a silicon substrate 71. A pattern as the object of inspection in which the lengths of the bottom insulating film 72 and contact plug 73 in the stacking direction satisfy a predetermined condition is a normal pattern. A pattern as the object of inspection in which the length of the bottom insulating film 72 in the stacking direction is longer than a predetermined value and the length of the contact plug 73 in the stacking direction is shorter than a predetermined value (second contact plug from the left) is a defective pattern.

FIG. 5 shows an example of scanning electron microscope images of the sample used in gain and offset adjustments in this embodiment. The patterns contained in the images illustrated in FIG. 5 are all normal patterns. The image brightness is set so as to be expressed by 256 gradation levels. In the figures used in the embodiments described hereinafter, hole patterns which differ depending on brightness are shown in order to indicate the degree of brightness. The gage illustrated in FIG. 5 indicates that the more rightward the hole pattern is, the brightness is higher (the more leftward, the brightness is lower). The example in FIG. 5 shows that under the first intermittent condition, the hole pattern brightness after brightness adjustment is lower than the hole pattern brightness before brightness adjustment.

The first intermittent condition was set to 0.1 µs as irradiation time and 1 µs as interval time between irradiation points. The second intermittent condition was set to 0.1 µs as irradiation time and 5 µs as interval time between irradiation points. Here, irradiation time and interval time between irradiation points for brightness were set on the basis that time to irradiate one pixel of an image with an electron beam is the minimum unit.

Before brightness adjustment, the brightness of the inspection pattern obtained under the first intermittent condition was 80 and the brightness of the inspection pattern obtained under the second intermittent condition was 100. In this embodiment, the convergence value (desired set brightness value) of brightness of the inspection pattern obtained under the first intermittent condition was set to 50 and the convergence value of brightness difference of the inspection patterns obtained under the first intermittent condition and second intermittent condition was set to 200 and then brightness adjustment was performed. If the adjustment result was within the preset convergence value +/−10%, it was decided that convergence was achieved. Gain and offset were adjusted according to the flowchart in FIG. 2 so that the brightness of the inspection pattern obtained under the first intermittent condition is 50 and the brightness of the inspection pattern obtained under the second intermittent condition is 250.

In the flowchart in FIG. 2, gain adjustment is performed after offset adjustment is performed, but it is acceptable to reverse the order. Furthermore, in this embodiment, offset adjustment and gain adjustment were performed after two images were acquired, but it is also acceptable to acquire one image to perform an adjustment and then acquire another image to perform another adjustment. Offset adjustment is performed by adjusting the bias voltage of the amplifier for amplifying output of the detector so that, for example, the lower value becomes a predetermined value (50 in the above example). Gain adjustment is performed by adjusting the detector so that the difference between the lower value and higher value becomes a predetermined value (200 in the above example).

Since an electron beam has electric charge, when the sample as the object of inspection is irradiated with a beam to generate an image, electric charge is accumulated. On the other hand, when irradiation of the electron beam is stopped, the accumulated electric charge goes out (relaxed). Specifically, when the sample is irradiated with a beam intermittently, accumulation of electric charge (charging) with electron beam irradiation and relaxation of the accumulation (discharging) without electron beam irradiation are repeated. When the first intermittent condition beam is compared with the second intermittent condition beam, the irradiation time is the same but the interval time is shorter and charge is less relaxed and more electric charge is accumulated on the pattern.

On the other hand, since the defective pattern (second contact plug from the left) illustrated in FIG. 4 has a thicker bottom insulating film 72 (namely smaller capacitance) than the normal pattern, it may be said to be a pattern in which the sample surface voltage is easily accumulated due to charge accumulation (namely, it is less affected by discharge). The reason that a beam with a relatively short interval time (easy to accumulate electric charge) as the first intermittent condition was used to form an image is to electrify a normal inspection object pattern in the same way as a defective pattern. By adjusting gain and offset so that the brightness of the inspection object pattern with this sample state becomes a desired predetermined value (50 in the above embodiment), the contrast against the normal pattern which is set to achieve brightness 250 can be increased.

FIG. 6 shows an example of inspection images through the scanning electron microscope as acquired in this embodiment. FIG. 6 shows images acquired for inspection under the second intermittent condition. Among the inspection patterns in the inspection images in FIG. 6, one is a defective pattern and the others are normal patterns.

First, looking at the normal pattern, while the brightness of the normal pattern is 100 before brightness adjustment, it is 250 after brightness adjustment. Then, looking at the defective pattern, while the brightness of the defective pattern is 85 before brightness adjustment, it is 50 after brightness adjustment. In other words, while the brightness difference between the normal pattern and defective pattern before brightness adjustment is 15, after brightness adjustment it is increased to 200. This means that the defective pattern detection sensitivity was improved by the adjustment.

FIG. 7 shows an example of scanning electron microscope images acquired with gain and offset adjustments in this embodiment. The patterns in the images and the first intermittent condition and second intermittent condition in FIG. 7 are the same as in FIG. 5. Before brightness adjustment, the brightness of the inspection pattern obtained under the first intermittent condition was 0 and the brightness of the inspection patterns obtained under the second intermittent condition was 250. However, the inspection patterns obtained under the second intermittent condition include a plurality of patterns with brightness 0 and patterns with brightness larger than 0 and smaller than 250. The convergence value of brightness of the inspection pattern obtained under the first intermittent condition and the convergence value of brightness difference between the inspection patterns obtained under the first intermittent condition and second intermittent condition were set to the same values as in FIG. 5 and then brightness adjustment was performed.

FIG. 8 shows an example of inspection images through the scanning electron microscope as acquired in this embodiment. FIG. 8 shows images acquired under the second intermittent condition. Among the inspection patterns in the inspection images in FIG. 8, one is a defective pattern and the others are normal patterns.

While before brightness adjustment a plurality of patterns with brightness 0 were detected, after brightness adjustment only one pattern with brightness 50 was detected and the brightness of the other patterns was 250. Since before brightness adjustment the patterns with brightness 0 include both a normal pattern and a defective pattern, if a pattern with brightness 0 was judged as a defective pattern, misinformation that a normal pattern is mistakenly judged as a defective pattern occurred. On the other hand, after brightness adjustment, a pattern with brightness 50 was judged as a defective pattern, which prevented misinformation. In short, the misinformation rate can be reduced by adjustment.

According to the above embodiment, the defective pattern detection sensitivity was improved and the misinformation rate was reduced by acquiring images by electron beam scanning under a plurality of different intermittent conditions and adjusting so that the brightness of the plural inspection patterns and the brightness difference between inspection patterns become predetermined values.

In the above embodiment, an explanation has been made of the example that the brightness value as a characteristic in each of different beam conditions is evaluated and gain and offset are adjusted so that the characteristic becomes a predetermined value (convergence value). However, instead of brightness value itself, another parameter which varies with brightness value may be used as the characteristic to be evaluated. For example, another parameter such as brightness ratio against the background (contrast) or pattern edge sharpness may be evaluated to perform adjustment using an adjuster so that the object of evaluation becomes a predetermined value. In addition, regarding beam conditions, not only interval time between irradiation points and irradiation time but also other beam conditions to enable reproduction of a defective pattern from a normal pattern may be adopted.

Second Embodiment

This embodiment concerns an inspection device which identifies a defective spot from brightness difference in a scanning electron microscope image, and describes a scanning electron microscope which adjusts the brightness of an image so that even if the area used to adjust the image brightness contains only a normal pattern, the sensitivity of detection of a defective pattern with large brightness can be improved and the misinformation rate can be reduced. In this embodiment, the scanning electron microscope shown in FIG. 1 was used. In this embodiment, gain adjustment and offset adjustment were performed using the flowchart shown in FIG. 2. In this embodiment, the operation interface shown in FIG. 3 was used.

Defect inspection using the scanning electron microscope for which the gain adjustment and offset adjustment have been performed is described below. FIG. 9 is a sectional view of part of the sample used in this embodiment. The sample in FIG. 9 has a structure that a phosphorous-implanted impurity diffusion layer 82 is formed in part of a boron-implanted silicon substrate 81 and a contact plug 83 or interlayer insulating film 84 is stacked over the silicon substrate 81. In this embodiment, scanning electron microscope images of the contact plug 83 are inspection patterns. Among them, an inspection pattern in which the contact plug 83 is formed perpendicularly to the silicon substrate 81 and the entire bottom surface of the contact plug 83 contacts the impurity diffusion layer 82 is a normal pattern. On the other hand, an inspection pattern in which the contact plug 83 is not formed perpendicularly to the silicon substrate 81 and the bottom surface of the contact plug 83 partially or entirely contacts the silicon substrate 81 is a defective pattern.

FIG. 10 shows an example of scanning electron microscope images acquired with gain and offset adjustments in this embodiment. The patterns in the images in FIG. 10 are all normal patterns. The image brightness is set so as to be expressed by 256 gradation levels. The first intermittent condition was set to 2 μs as irradiation time and 0 μs as interval time between irradiation points (namely, a state in which a beam is scanned not intermittently but continuously) and the second intermittent condition was set to 2 μs as irradiation time and 10 μs as interval time between irradiation points. Here, irradiation time and interval time between irradiation points for brightness were controlled on the basis that time to irradiate one pixel of an image with an electron beam is the minimum unit. Before brightness adjustment, the brightness of the inspection pattern obtained under the first intermittent condition was 140 and the brightness of the inspection pattern obtained under the second intermittent condition was 180.

In this embodiment, the convergence value of brightness of the inspection pattern obtained under the first intermittent condition was set to 80 and the convergence value of brightness difference between the inspection patterns obtained under the first intermittent condition and second intermittent condition was set to 150 and then brightness adjustment was performed. If the adjustment result is within the preset convergence value +/−10%, it was decided that convergence was achieved. Gain and offset were adjusted according to the flowchart in FIG. 2 so that the brightness of the inspection pattern obtained under the first intermittent condition is 80 and the brightness of the inspection pattern obtained under the second intermittent condition is 230.

The defective pattern illustrated in FIG. 9 (second contact plug 83 from the left) is directly joined to the silicon substrate 81 as compared with the normal pattern, so it may be said to be a pattern in which the electric resistance is small and the electric charge is easily discharged. In this embodiment, the reason that a beam with a relatively long interval time (electric charge is easily discharged) as the second intermittent condition (irradiation time 2 µs, interval time between irradiation points 10 µs) was used to form an image is to electrify a normal inspection pattern in the same way as a defective pattern. It may be said that while in the case of the defect illustrated in FIG. 4 the defective pattern is a pattern which is more easily electrified than the normal pattern, in the case of the defective pattern illustrated in FIG. 9 the defective pattern is less likely to be electrified than the normal pattern (electric charge is easily discharged) since the electric resistance is smaller.

Therefore, the contrast against the normal pattern can be expanded by irradiating the normal pattern with a less electrifiable beam (second intermittent condition beam) than an inspection beam to reproduce the brightness of the defective pattern irradiated with the inspection beam (first intermittent condition beam) and also adjusting gain and offset so that the brightness of the defective pattern becomes a predetermined value (convergence value remote from the convergence value of the normal pattern).

Figure 11:
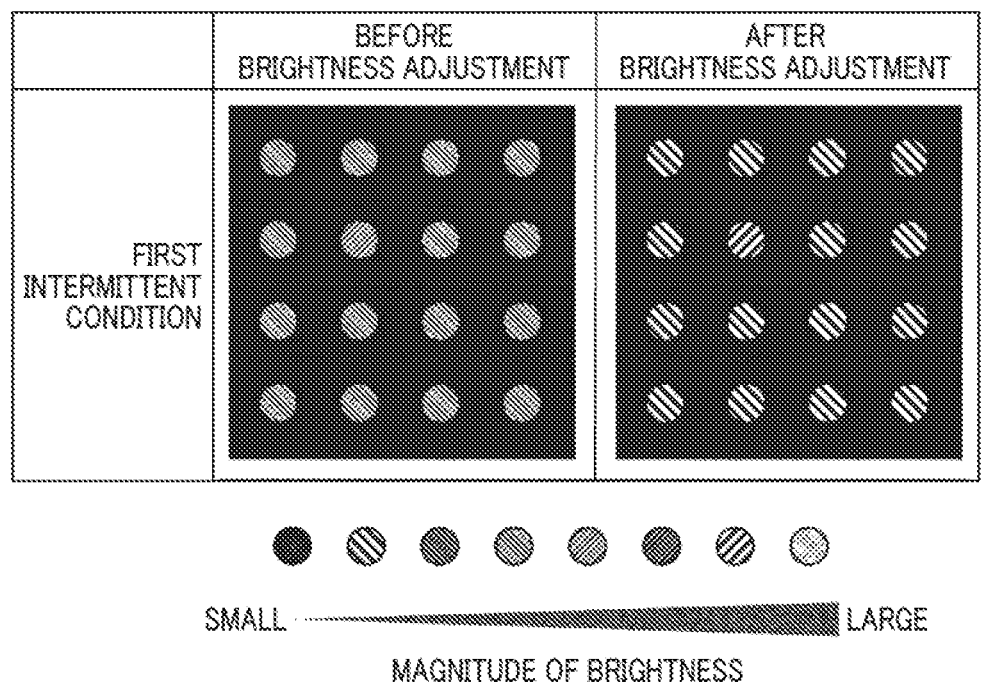
FIG. 11 shows an example of scanning electron microscope images.

FIG. 11 shows an example of inspection images through the scanning electron microscope in this embodiment. FIG. 11 shows inspection images acquired under the first intermittent condition. Among the inspection patterns in the inspection images in FIG. 11, one is a defective pattern and the others are normal patterns.

First, looking at the normal pattern, while the brightness of the normal pattern is 140 before brightness adjustment, it is 80 after brightness adjustment. Then, looking at the defective pattern, while the brightness of the defective pattern is 175 before brightness adjustment, it is 225 after brightness adjustment. In other words, while the brightness difference between the normal pattern and defective pattern before brightness adjustment is 35, after brightness adjustment it is increased to 145. This means that the defective pattern detection sensitivity was improved by the adjustment.

FIG. 12 shows an example of scanning electron microscope images acquired with gain and offset adjustments in this embodiment. The patterns in the images and the first intermittent condition and second intermittent condition in FIG. 12 are the same as in FIG. 10. Before brightness adjustment, the brightness of the inspection pattern obtained under the first intermittent condition was 20 and the brightness of the inspection patterns obtained under the second intermittent condition was 255. The convergence value of brightness of the inspection pattern obtained under the first intermittent condition and the convergence value of brightness difference between the inspection patterns obtained under the first intermittent condition and second intermittent condition were set to the same values as in FIG. 10 and then brightness adjustment was performed.

Figure 13:
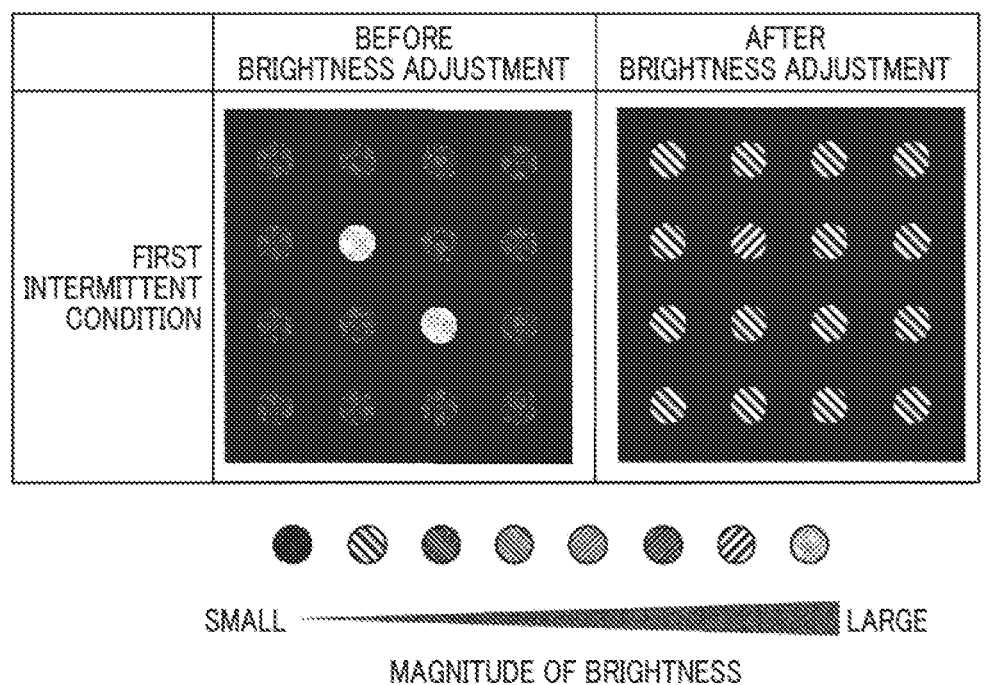
FIG. 13 shows an example of scanning electron microscope images.

FIG. 13 shows an example of inspection images through the scanning electron microscope as acquired in this embodiment. FIG. 13 shows images acquired under the first intermittent condition. Among the inspection patterns in the inspection images in FIG. 13, one is a defective pattern and the others are normal patterns.

While a plurality of patterns with brightness 255 were detected before brightness adjustment, only one pattern with brightness 175 was detected after brightness adjustment and the brightness of the other patterns was 50. Since before brightness adjustment the patterns with brightness 255 include both a normal pattern and a defective pattern, if a pattern with brightness 255 was judged as a defective pattern, misinformation that a normal pattern is mistakenly judged as a defective pattern occurred. On the other hand, after brightness adjustment, a pattern with brightness 175 can be judged as a defective pattern, which can prevent misinformation and reduce the misinformation rate.

According to the above embodiment, the defective pattern detection sensitivity was improved and the misinformation rate was reduced by acquiring images by electron beam scanning under a plurality of different intermittent conditions and adjusting so that the brightness of the plural inspection patterns and the brightness difference between inspection patterns become predetermined values.

Third Embodiment

This embodiment concerns an inspection device which identifies a defective spot from brightness difference in a scanning electron microscope image, and describes a scanning electron microscope which adjusts the brightness of an image so that even if the area used to adjust the image brightness only contains a normal pattern, the sensitivity of detection of a defective pattern with large brightness can be improved and the misinformation rate can be reduced. In this embodiment, the scanning electron microscope shown in FIG. 1 was used. In this embodiment, gain adjustment and offset adjustment were performed using the flowchart shown in FIG. 2. In this embodiment, the operation interface shown in FIG. 3 was used.

Figure 14:
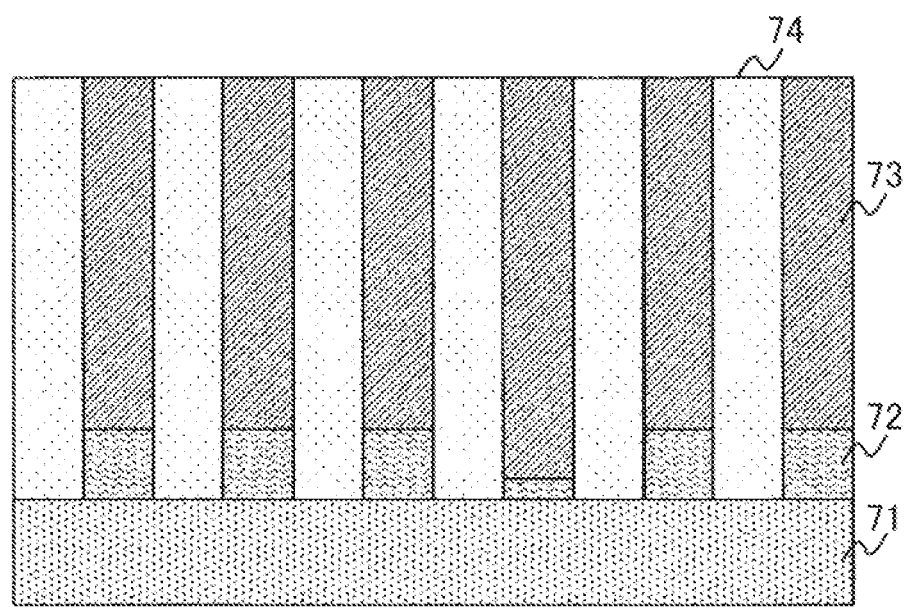
FIG. 14 shows the cross-section structure of a sample in the third embodiment.

Defect inspection using the scanning electron microscope for which gain adjustment and offset adjustment have been performed is described below. FIG. 14 is a sectional view of part of the sample used in this embodiment. As in FIG. 4, the sample used in this embodiment has a structure that a bottom insulating film 72 and a contact plug 73 or an interlayer insulating film 74 are stacked over a silicon substrate 71. Also, as in FIG. 4, scanning electron microscope images of the contact plug 73 are inspection patterns. If the lengths of the bottom insulating film 72 and contact plug 73 in the stacking direction are predetermined values, the inspection pattern is a normal pattern. On the other hand, unlike FIG. 4, if the length of the bottom insulating film 72 in the stacking direction is shorter than the predetermined value and the length of the contact plug 73 in the stacking direction is longer than the predetermined value, the inspection pattern (third contact plug from the right) is a defective pattern.

FIG. 15 shows an example of scanning electron microscope images acquired with gain and offset adjustments in this embodiment. The patterns in the images in FIG. 15 are all normal patterns. The image brightness is set so as to be expressed by 256 gradation levels. The first intermittent condition was set to 10 nm as irradiation distance and 100 nm as distance between irradiation points and the second intermittent condition was set to 10 nm as irradiation distance and 500 nm as distance between irradiation points. Here, irradiation distance and distance between irradiation points for brightness were controlled on the basis that distance to irradiate one pixel of an image with an electron beam is the minimum unit. Before brightness adjustment, the brightness of the inspection pattern obtained under the first intermittent condition was 90 and the brightness of the inspection pattern obtained under the second intermittent condition was 100. In this embodiment, the convergence value of brightness of the inspection pattern obtained under the first intermittent condition was set to 20 and the convergence value of brightness difference between the inspection patterns obtained under the first intermittent condition and second intermittent condition was set to 80 and then brightness adjustment was performed. If the adjustment result is within the preset convergence value +/−10%, it was decided that convergence was achieved. Gain and offset were adjusted according to the flowchart in FIG. 2 so that the brightness of the inspection pattern obtained under the first intermittent condition is 20 and the brightness of the inspection pattern obtained under the second intermittent condition is 100.

In this embodiment, unlike the first embodiment, irradiation distance and distance between irradiation points are used as parameters to control charging and discharging instead of irradiation time and interval time between irradiation points. If the beam scanning speed is fixed, charging and discharging can be controlled by appropriately setting the irradiation distance and distance between irradiation points as in the case of irradiation time and interval time between irradiation points.

FIG. 16 shows an example of inspection images through the scanning electron microscope in this embodiment. FIG. 16 shows inspection images acquired under the second intermittent condition. Among the inspection patterns in the inspection images in FIG. 16, one is a defective pattern and the others are normal patterns.

First, looking at the normal pattern, the brightness of the normal pattern is 100 both before brightness adjustment and after brightness adjustment. Then, looking at the defective pattern, while the brightness of the defective pattern is 110 before brightness adjustment, it is 180 after brightness adjustment. In other words, while the brightness difference between the normal pattern and defective pattern before brightness adjustment was 10, after brightness adjustment it was increased to 80. This means that the defective pattern detection sensitivity was improved by the adjustment.

Figure 17:
FIG. 17 shows an example of scanning electron microscope images.

FIG. 17 shows an example of scanning electron microscope images acquired with gain and offset adjustments in this embodiment. The patterns in the images and the first intermittent condition and second intermittent condition in FIG. 17 are the same as in FIG. 15. Before brightness adjustment, the brightness of the inspection patterns obtained under the first intermittent condition was 0 and the brightness of the inspection patterns obtained under the second intermittent condition was 130. The convergence value of brightness of the inspection pattern obtained under the first intermittent condition and the convergence value of brightness difference between the inspection patterns obtained under the first intermittent condition and second intermittent condition were set to the same values as in FIG. 15 and then brightness adjustment was performed.

Figure 18:
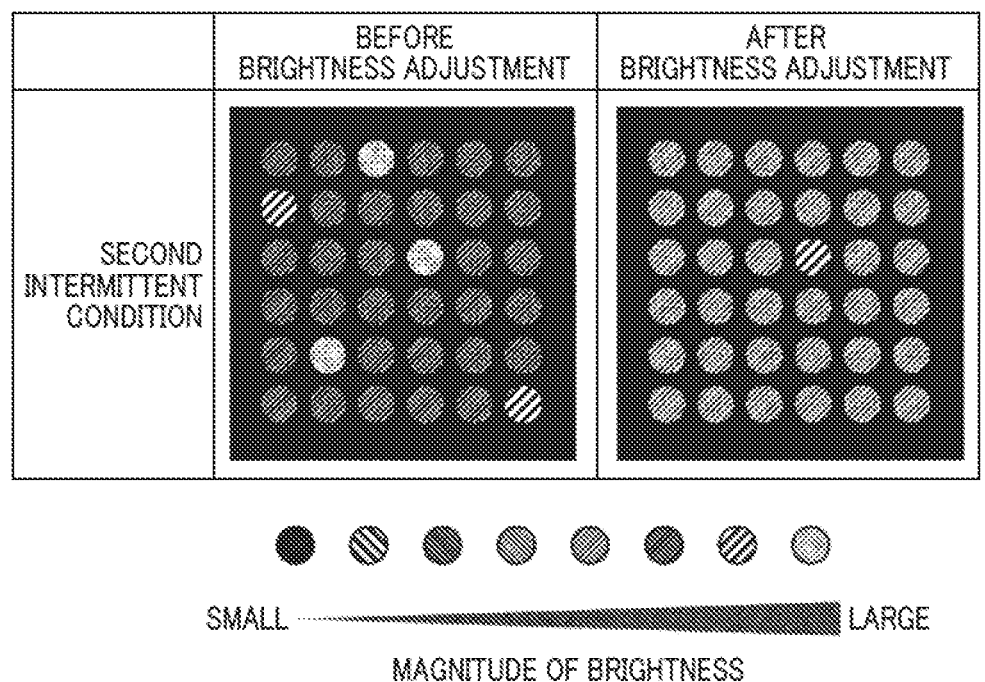
FIG. 18 shows an example of scanning electron microscope images.

FIG. 18 shows an example of inspection images through the scanning electron microscope as acquired in this embodiment. FIG. 18 shows inspection images acquired under the second intermittent condition. Among the inspection patterns in the inspection images in FIG. 18, one is a defective pattern (pattern which is the fourth from the left and the third from top) and the others are normal patterns.

While a plurality of patterns with brightness 256 were detected before brightness adjustment, only one pattern with brightness 180 was detected after brightness adjustment and the brightness of the other patterns was 100. Since before brightness adjustment the patterns with brightness 256 include both a normal pattern and a defective pattern, if a pattern with brightness 256 was judged as a defective pattern, misinformation that a normal pattern is mistakenly judged as a defective pattern occurred. On the other hand, after brightness adjustment, a pattern with brightness 180 was judged as a defective pattern, which prevented misinformation. In short, the misinformation rate could be reduced by the adjustment.

According to the above embodiment, the defective pattern detection sensitivity was improved and the increase in the misinformation rate was suppressed by acquiring images by electron beam scanning under a plurality of different intermittent conditions and adjusting so that the brightness of the plural inspection patterns and the brightness difference between inspection patterns become predetermined values.

Fourth Embodiment

This embodiment concerns an inspection device which identifies a defective spot from brightness difference in a scanning electron microscope image, and describes a scanning electron microscope which adjusts the brightness of an image and determines the intermittent condition for defect inspection so that even if the area used to adjust the image brightness contains only a normal pattern, the defective pattern detection sensitivity can be improved and the misinformation rate can be reduced.

Figure 19:
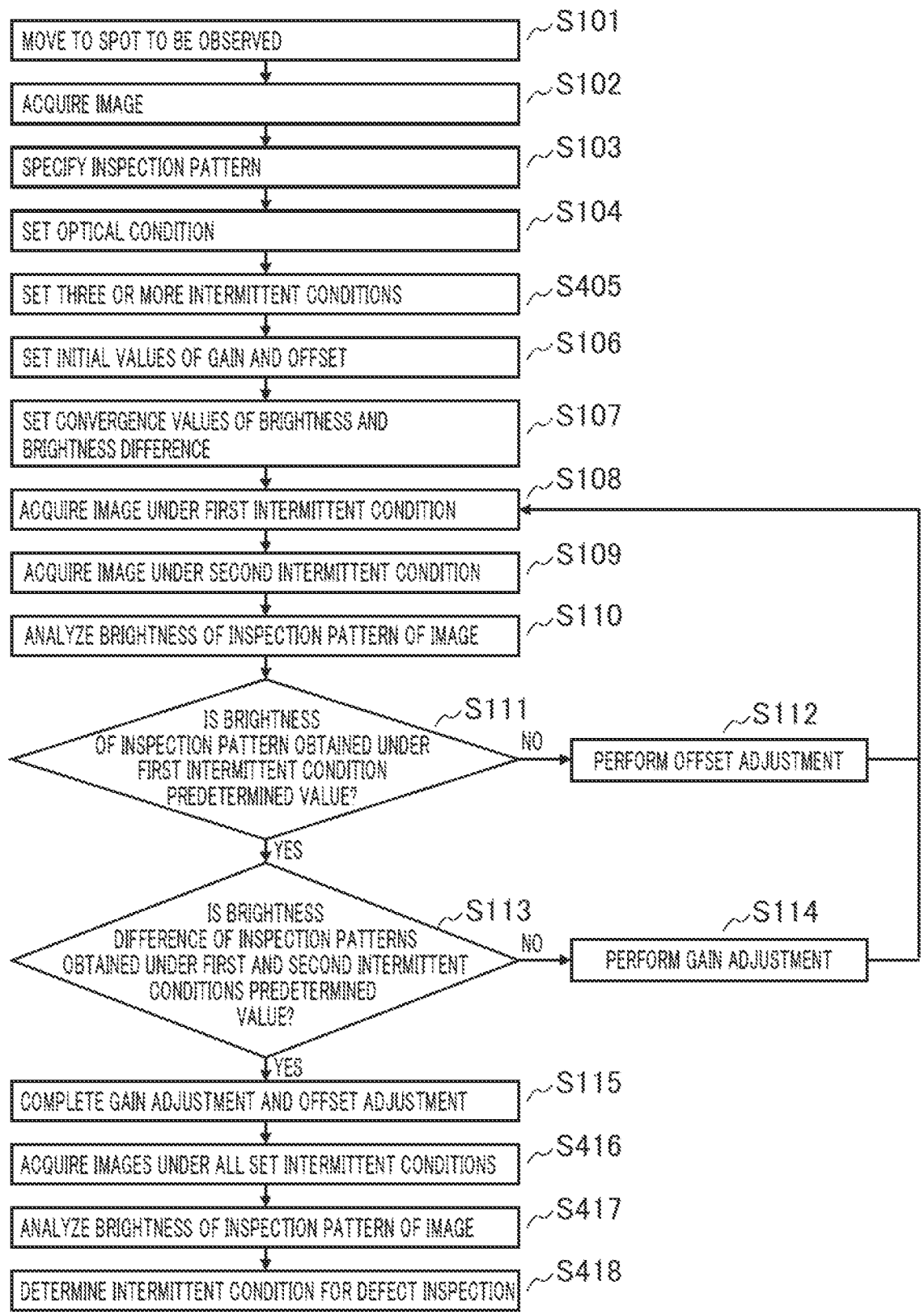
FIG. 19 is a flowchart which shows the process of performing gain adjustment and offset adjustment and determining an intermittent condition.

In this embodiment, the scanning electron microscope shown in FIG. 1 was used. FIG. 19 shows a flowchart which shows the process of performing gain adjustment and offset adjustment and determining the intermittent condition. The basic flow in this embodiment is the same as the flow in FIG. 2. In the flow in this embodiment, when setting a plurality of intermittent conditions, three or more intermittent conditions are set (S405). After gain adjustment and offset adjustment are completed, images are acquired under the three or more set intermittent conditions (S416) and the brightness of the inspection patterns of the acquired images is analyzed (S417). Then, the intermittent condition for defect inspection is determined from the brightness of the inspection patterns (S418).

The three or more intermittent conditions set in this embodiment are different in interval time between irradiation points as an intermittent condition. In this embodiment, the average rate of change in brightness with respect to change in interval time between irradiation points was calculated and among the set intermittent conditions with different interval times between irradiation points, the condition which corresponds to the highest average rate of change in brightness was determined as the intermittent condition. In this embodiment, the operation interface shown in FIG. 3 was used.

Figure 20:
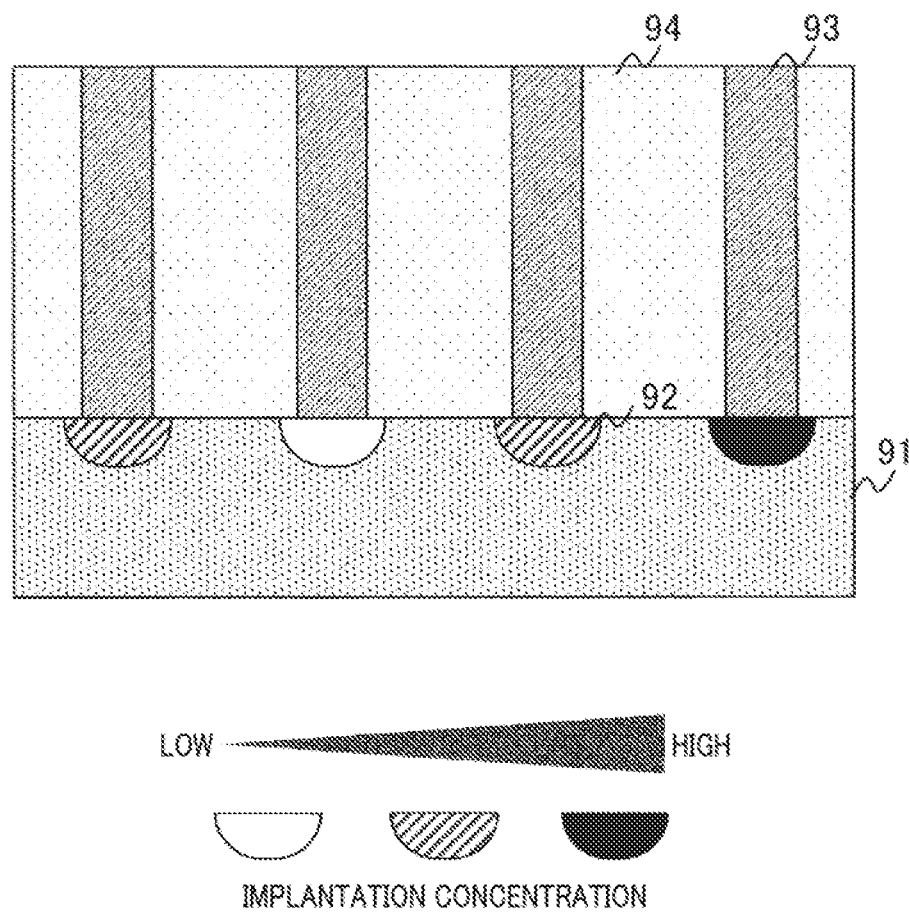
FIG. 20 shows the cross-section structure of a sample in the fourth embodiment.

Defect inspection using the scanning electron microscope for which gain adjustment and offset adjustment have been performed is described below. FIG. 20 is a sectional view of part of the sample used in this embodiment. The sample in FIG. 20 has a structure that a boron-implanted impurity diffusion layer 92 is formed in part of a phosphorous-implanted silicon substrate 91 and a contact plug 93 or an interlayer insulating film 94 is stacked over the silicon substrate 91. In this embodiment, scanning electron microscope images of the contact plug 93 are inspection patterns. Among them, an inspection pattern in which the impurity concentration of the impurity diffusion layer 92 joined to the contact plug 93 is a predetermined value is a normal pattern and an inspection pattern in which the impurity concentration is larger or smaller than the predetermined value is a defective pattern.

FIG. 21 shows an example of scanning electron microscope images acquired in this embodiment. The patterns in the images in FIG. 21 are all normal patterns. The image brightness was set so as to be expressed by 256 gradation levels. The first intermittent condition was set to 20 µs as irradiation time and 20 µs as interval time between irradiation points and the second intermittent condition was set to 20 µs as irradiation time and 100 µs as interval time between irradiation points. Here, irradiation time and interval time between irradiation points for brightness were controlled on the basis that time to irradiate one line by scanning with an electron beam is the minimum unit.

Before brightness adjustment, the brightness of the inspection pattern obtained under the first intermittent condition was 140 and the brightness of the inspection pattern obtained under the second intermittent condition was 150. In this embodiment, the convergence value of brightness of the inspection pattern obtained under the first intermittent condition was set to 40 and the convergence value of brightness difference between the inspection patterns obtained under the first intermittent condition and second intermittent condition was set to 180 and then brightness adjustment was performed. If the adjustment result is within the preset convergence value +/−10%, it was decided that convergence was achieved. Gain and offset were adjusted according to the flowchart in FIG. 19 so that the brightness of the inspection pattern obtained under the first intermittent condition is 40 and the brightness of the inspection pattern obtained under the second intermittent condition is 220.

The fourth contact plug 93 from the left in FIG. 20 has a pattern with a higher concentration of implantation by an ion implantation device than a normal pattern (for example, the leftmost contact plug 93). In other words, it may be said to be a pattern in which the electric resistance is small and the electric charge is easily discharged. On the other hand, the second contact plug 93 from the left has a pattern with a lower implantation concentration than the normal pattern. In other words, it may be said to be a pattern in which the electric resistance is large and discharging hardly occurs.

In this embodiment, the reason that two types of beams which are largely different in interval time between irradiation points (20 µs and 100 µs) were used to form an image is to make it possible to identify a wide range of charged states from a more electrifiable pattern than the normal pattern to a less electrifiable pattern than the normal pattern. In this embodiment, an explanation is made of an example that an appropriate beam condition is identified by generating images under a plurality of intermittent conditions whose interval time ranges between interval times of the first intermittent condition beam and the second intermittent condition beam.

FIG. 22 shows an example of scanning electron microscope images acquired with beams under a plurality of intermittent conditions. FIG. 22 shows inspection images acquired under all five intermittent conditions set at S405, after gain adjustment and offset adjustment were completed. Here, the third intermittent condition is 20 µs as irradiation time and 40 µs as interval time between irradiation points; the fourth intermittent condition is 20 µs as irradiation time and 60 µs as interval time between irradiation points; and the fifth intermittent condition is 20 µs as irradiation time and 80 µs as interval time between irradiation points.

Figure 23:
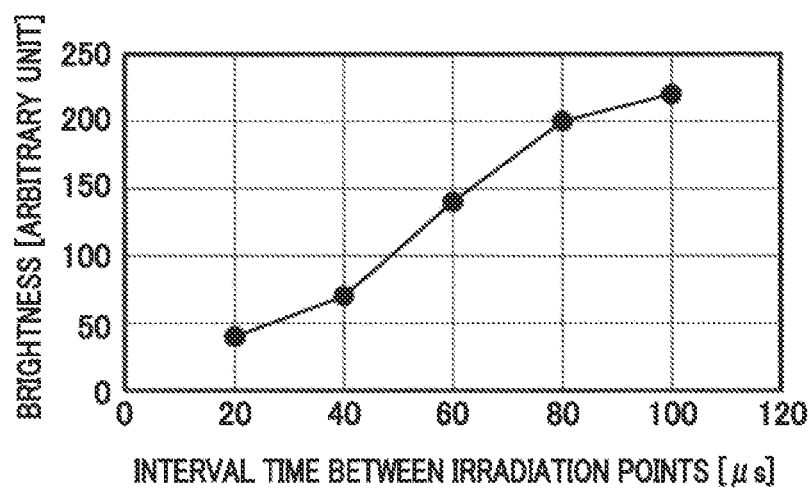
FIG. 23 shows the relation between brightness of inspection patterns in a scanning electron microscope image and interval time between irradiation points for each image.

FIG. 23 shows the relation between the brightness of the inspection patterns in the scanning electron microscope images shown in FIG. 22 and interval time between irradiation points for the images. In the range of interval time between irradiation points from 20 µs to 100 µs, the average rate of change in brightness is the highest at 60 µs as interval time between irradiation points, so the intermittent condition with interval time between irradiation points 60 µs, namely the fourth intermittent condition was determined as the intermittent condition for defect inspection.

According to the beam condition determination method for inspection images as mentioned above, an appropriate beam condition can be selected under appropriately set gain and offset conditions. Although this embodiment describes an example that interval time between irradiation points 60 µs which corresponds to the highest rate of change in brightness with respect to change in interval time is selected, the method is not limited thereto. If there is an ideal rate of change in brightness, the value concerned may be used as a predetermined value to select the interval time corresponding to the predetermined value. Also, if inspection with fixed brightness is desired, the fixed brightness value may be used as a predetermined value to select the interval time corresponding to the predetermined value.

Figure 24:
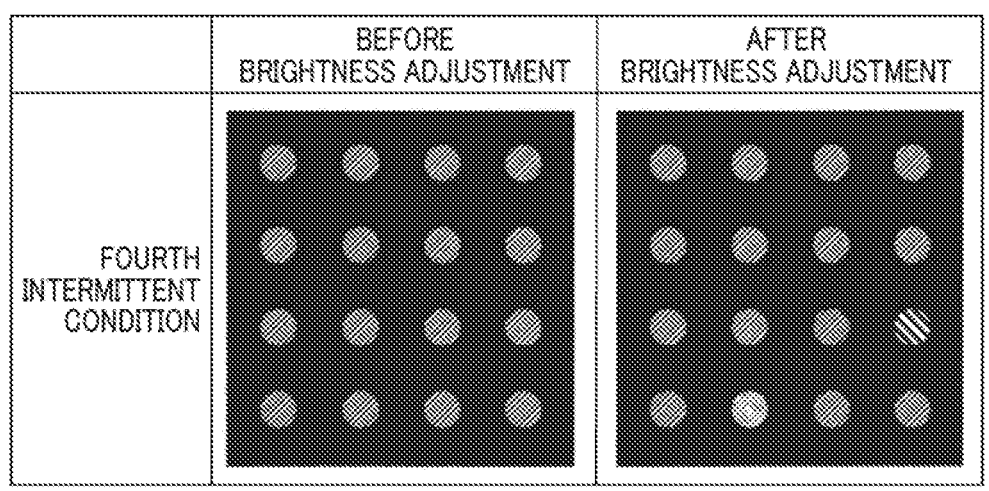
FIG. 24 shows an example of scanning electron microscope images.

FIG. 24 shows an example of scanning electron microscope images acquired in this embodiment. FIG. 24 shows the inspection images acquired under the fourth intermittent condition. Among the inspection patterns in the inspection images in FIG. 24, there are one defective pattern with an impurity concentration larger than the predetermined value and one defective pattern (third from top and fourth from the left) with an impurity concentration smaller than the predetermined value and the others are normal patterns.

First, looking at the normal pattern, while the brightness of the normal pattern is 145 before brightness adjustment, it is 140 after brightness adjustment. Then, looking at the defective patterns, while before brightness adjustment the brightness of the defective pattern with an impurity concentration larger than the predetermined value and the brightness of the defective pattern with an impurity concentration smaller than the predetermined value are both 145, after brightness adjustment the brightness of the defective pattern with an impurity concentration larger than the predetermined value is 190 and the brightness of the defective pattern with an impurity concentration smaller than the predetermined value is 90. In other words, while the brightness difference between the normal pattern and defective patterns before brightness adjustment is 0, it is increased to 50 after brightness adjustment. This means that the defective pattern detection sensitivity was improved by the adjustment.

FIG. 25 shows an example of scanning electron microscope images acquired with gain and offset adjustments in this embodiment. The inspection patterns in the inspection images and the first intermittent condition and second intermittent condition in FIG. 25 are the same as in FIG. 21. Before brightness adjustment, the brightness of the inspection pattern obtained under the first intermittent condition was 0 and the brightness of the inspection patterns obtained under the second intermittent condition was 255. The convergence value of brightness of the inspection pattern obtained under the first intermittent condition and the convergence value of brightness difference between the inspection patterns obtained under the first intermittent condition and second intermittent condition were set to the same values as in FIG. 22 and then brightness adjustment was performed.

Figure 26:
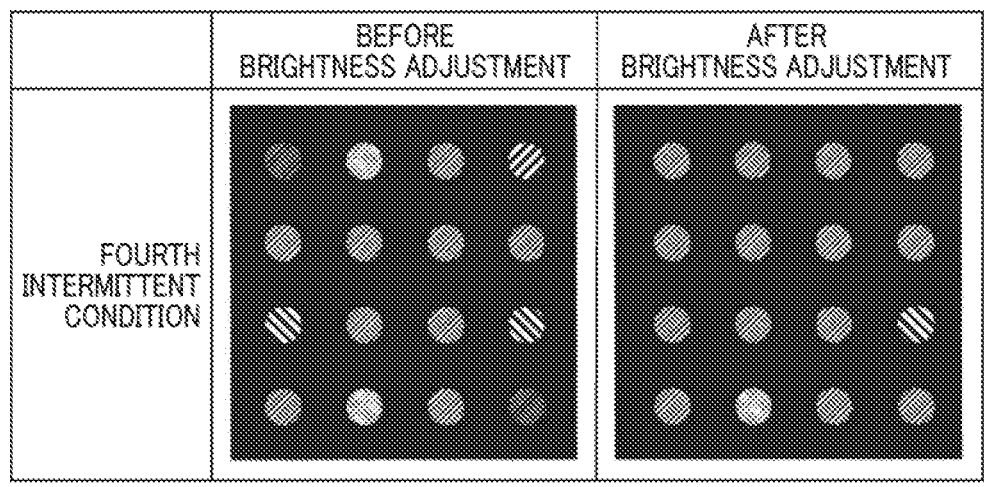
FIG. 26 shows an example of scanning electron microscope images.

FIG. 26 shows an example of scanning electron microscope images acquired in this embodiment. FIG. 26 shows images acquired under the fourth intermittent condition. Among the inspection patterns in the inspection images in FIG. 26, there are one defective pattern with an impurity concentration larger than the predetermined value and one defective pattern with an impurity concentration smaller than the predetermined value and the others are normal patterns.

While a plurality of patterns with brightness smaller than 140 and a plurality of patterns with brightness larger than 140 were detected before brightness adjustment, one pattern with brightness smaller than 140 (third from top and fourth from the left) and one pattern with brightness larger than 140 (fourth from top and second from the left) were only detected after brightness adjustment. While the brightness of some of the normal patterns was 140 before brightness adjustment, the brightness of all the normal patterns was 140 after brightness adjustment.

Since before brightness adjustment the patterns whose brightness is not 140 include both a normal pattern and a defective pattern, if a pattern whose brightness is not 140 was judged as a defective pattern, misinformation that a normal pattern is mistakenly judged as a defective pattern occurred. On the other hand, after brightness adjustment, by judging a pattern whose brightness is not 140, as a defective pattern, misinformation was prevented. In short, the misinformation rate could be reduced by the adjustment.

According to the above embodiment, the defective pattern detection sensitivity was improved and the misinformation rate was reduced by acquiring images by electron beam scanning under three or more different intermittent conditions, adjusting so that the brightness of the plural inspection patterns and the brightness difference between inspection patterns become predetermined values, and determining the intermittent condition from the average rate of change in brightness with respect to change in interval time between irradiation points.

Fifth Embodiment

This embodiment concerns an inspection device which identifies a defective spot from brightness difference in a scanning electron microscope image, and describes a scanning electron microscope which adjusts the brightness of an image so that even if the area used to adjust the image brightness contains both a normal pattern and a defective pattern, the defective pattern detection rate is improved and the increase in misinformation rate is suppressed. In this embodiment, the scanning electron microscope shown in FIG. 1 was used. In this embodiment, gain adjustment and offset adjustment were performed using the flowchart shown in FIG. 2. In this embodiment, the operation interface shown in FIG. 3 was used.

Figure 27:
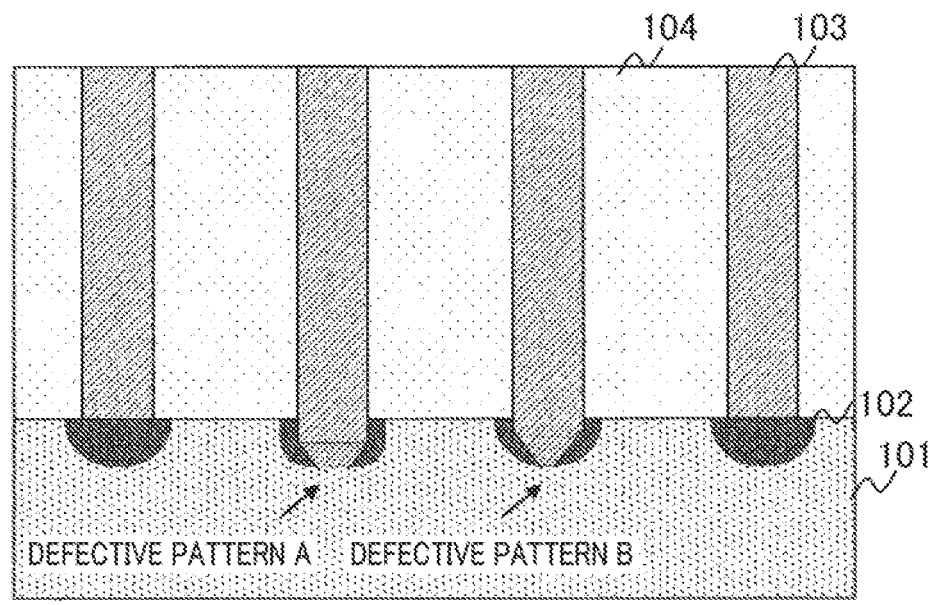
FIG. 27 shows the cross-section structure of a sample in the fifth embodiment.

Defect inspection using the scanning electron microscope for which gain adjustment and offset adjustment have been performed is described below. FIG. 27 is a sectional view of part of the sample used in this embodiment. The sample in FIG. 27 has a structure that an aluminum-implanted impurity diffusion layer 102 is formed in part of a nitrogen-implanted silicon carbide substrate 101 and a contact plug 103 or an interlayer insulating film 104 is stacked over the silicon carbide substrate 101.

In this embodiment, scanning electron microscope images of the contact plug 103 are inspection patterns. Among them, an inspection pattern in which the contact plug 103 stops at the impurity diffusion layer 102 and the entire bottom surface of the contact plug 103 contacts the impurity diffusion layer 102 is a normal pattern. On the other hand, an inspection pattern in which the contact plug 103 penetrates through the impurity diffusion layer 102 and part of the bottom surface of the contact plug 103 contacts the silicon carbide substrate 101 is a defective pattern. The defective patterns include a pattern with a large contact area between the bottom surface of the contact plug 103 and the silicon carbide substrate 101 (hereinafter, defective pattern A) and a pattern with a small contact area between the bottom surface of the contact plug 103 and the silicon carbide substrate 101 (hereinafter, defective pattern B).

Figure 28:
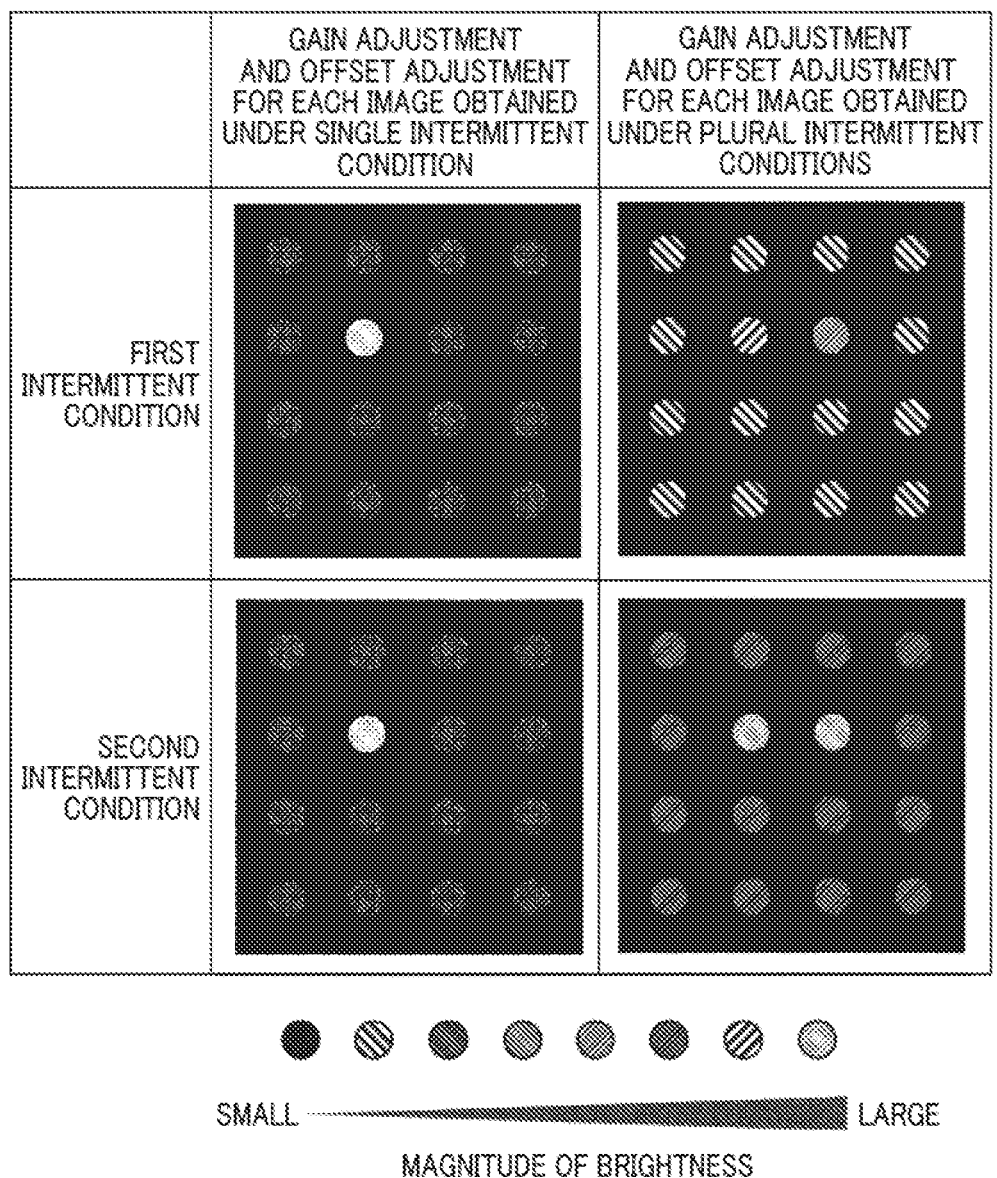
FIG. 28 shows an example of scanning electron microscope images.

FIG. 28 shows an example of the scanning electron microscope images acquired in this embodiment. Among the inspection patterns in the inspection images in FIG. 28, one is defective pattern A (second from top and second from the left) and one is defective pattern B (second from top and third from the left) and the others are normal patterns. The image brightness was set so as to be expressed by 256 gradation levels. The first intermittent condition was set to 0.1 μm as irradiation distance and 1 μm as distance between irradiation points and the second intermittent condition was set to 0.1 μm as irradiation distance and 5 μm as distance between irradiation points. Here, irradiation distance and distance between irradiation points for brightness were controlled on the basis that distance to irradiate one pixel of an image with an electron beam is the minimum unit.

When gain adjustment and offset adjustment were performed for each of the images acquired under the single intermittent condition without performing the process according to the flowchart in FIG. 2, both under the first intermittent condition and the second intermittent condition the brightness of defective pattern A was 200 and the brightness of defective pattern B and normal patterns was 30. In this embodiment, the convergence value of average brightness value of the inspection patterns obtained under the first intermittent condition was set to 50 and the convergence value of difference between the average brightness value of the inspection patterns obtained under the first intermittent condition and the average brightness value of the inspection patterns obtained under the second intermittent condition was set to 100 and then brightness adjustment (gain and offset adjustments) was performed. If the adjustment result is within the preset convergence value +/−10%, it was decided that convergence was achieved. Using the images acquired under a plurality of intermittent conditions, gain adjustment and offset adjustment were performed according to the flowchart in FIG. 2 so that the brightness of the inspection patterns obtained under the first intermittent condition is 50 and the brightness of the inspection patterns obtained under the second intermittent condition is 150.

After gain adjustment and offset adjustment, under the first intermittent condition, the brightness of defective pattern A was 150, the brightness of defective pattern B was 100, and the brightness of the normal pattern was 50 or more and 60 or less. Also, under the second intermittent condition, the brightness of defective pattern A was 210, the brightness of defective pattern B was 200, and the brightness of the normal pattern was 150 or more and 155 or less.

When gain adjustment and offset adjustment were performed for each of the images acquired under the single intermittent condition, since the patterns with brightness 30 include both defective pattern B and a normal pattern, if a pattern with brightness 30 was judged as a normal pattern, defective pattern B could not be detected. On the other hand, when gain adjustment and offset adjustment were performed for each of the images acquired under the plural intermittent conditions, defective pattern B could be detected by judging a pattern with brightness 60 or less under the first intermittent condition as a normal pattern and a pattern with brightness 100 or more as a defective pattern. In short, the defective pattern detection rate was improved.

Figure 29:
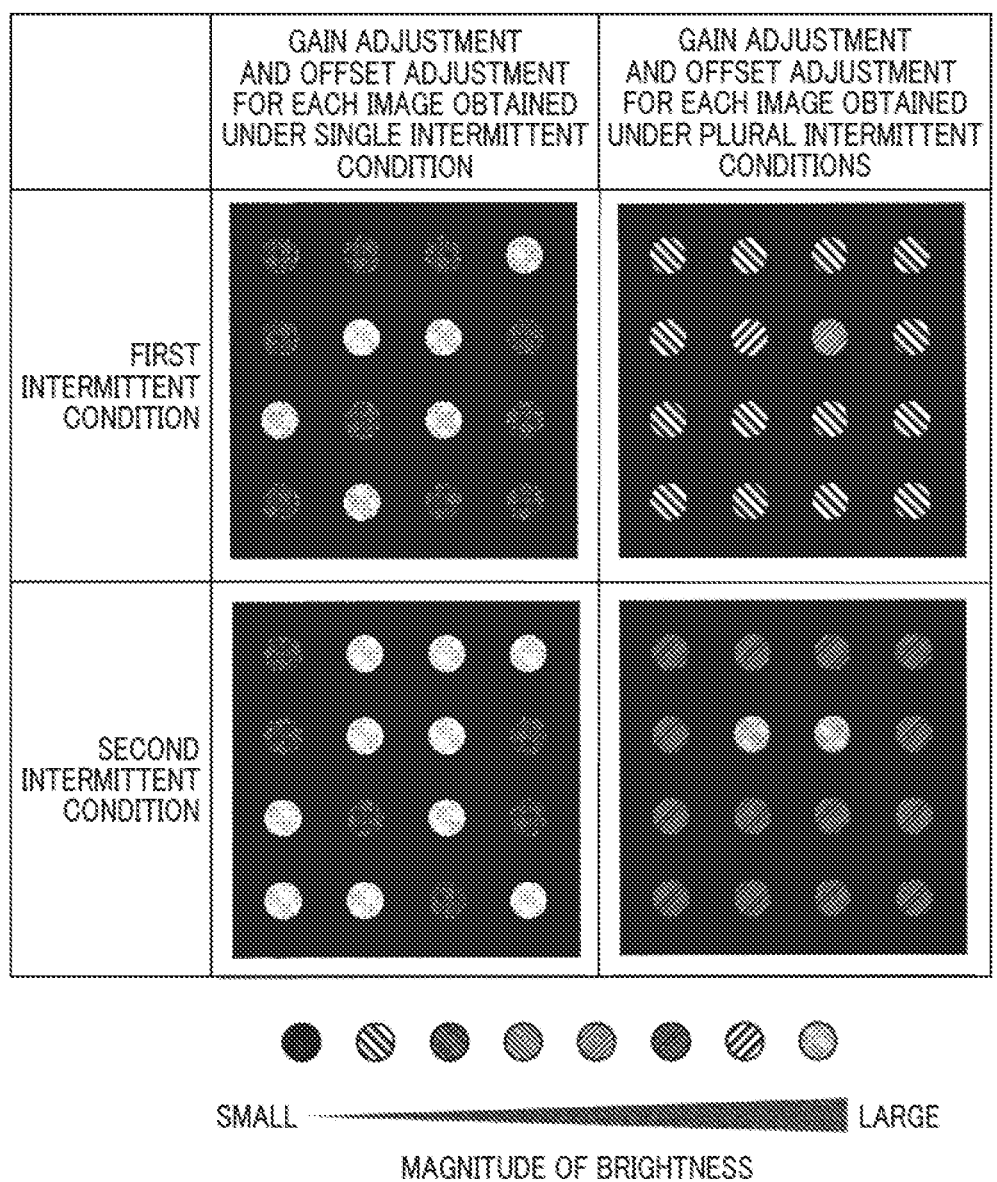
FIG. 29 shows an example of scanning electron microscope images.

FIG. 29 shows an example of scanning electron microscope images acquired in this embodiment. The inspection patterns in the inspection images and the first intermittent condition and second intermittent condition in FIG. 29 are the same as in FIG. 28. When gain adjustment and offset adjustment were performed for each of the images acquired under the single intermittent condition, both under the first intermittent condition and the second intermittent condition the brightness of defective pattern A and defective pattern B was 200, the brightness of normal patterns was 30 or more and 200 or less and a plurality of normal patterns with brightness 200 were included.

The convergence value of brightness of the inspection pattern obtained under the first intermittent condition and the convergence value of brightness difference between the inspection patterns obtained under the first intermittent condition and second intermittent condition were set to the same values in FIG. 28 and brightness adjustment was performed using the images acquired under the plural intermittent conditions. When gain adjustment and offset adjustment were performed for each of the images acquired under the single intermittent condition, since the patterns with brightness 200 included not only defective pattern A and defective pattern B but also normal patterns, so if a pattern with brightness 200 was judged as a defective pattern, misinformation that a normal pattern is mistakenly judged as a defective pattern occurred.

On the other hand, when gain adjustment and offset adjustment were performed for each of the images acquired under the plural intermittent conditions, misinformation was prevented by judging a pattern with brightness more than 100 as a defective pattern. In short, the increase in misinformation rate was suppressed.

According to the above embodiment, the defective pattern detection rate was improved and the increase in misinformation rate was suppressed by acquiring images by electron beam scanning under a plurality of different intermittent conditions and adjusting so that the brightness of the plural inspection patterns and the brightness difference between inspection patterns become predetermined values.

Sixth Embodiment

This embodiment concerns an inspection device which identifies a defective spot from brightness difference in a scanning electron microscope image, and describes a scanning electron microscope which automatically performs brightness adjustment using the images acquired under a plurality of intermittent conditions. In this embodiment, the scanning electron microscope shown in FIG. 1 was used.

Figure 30:
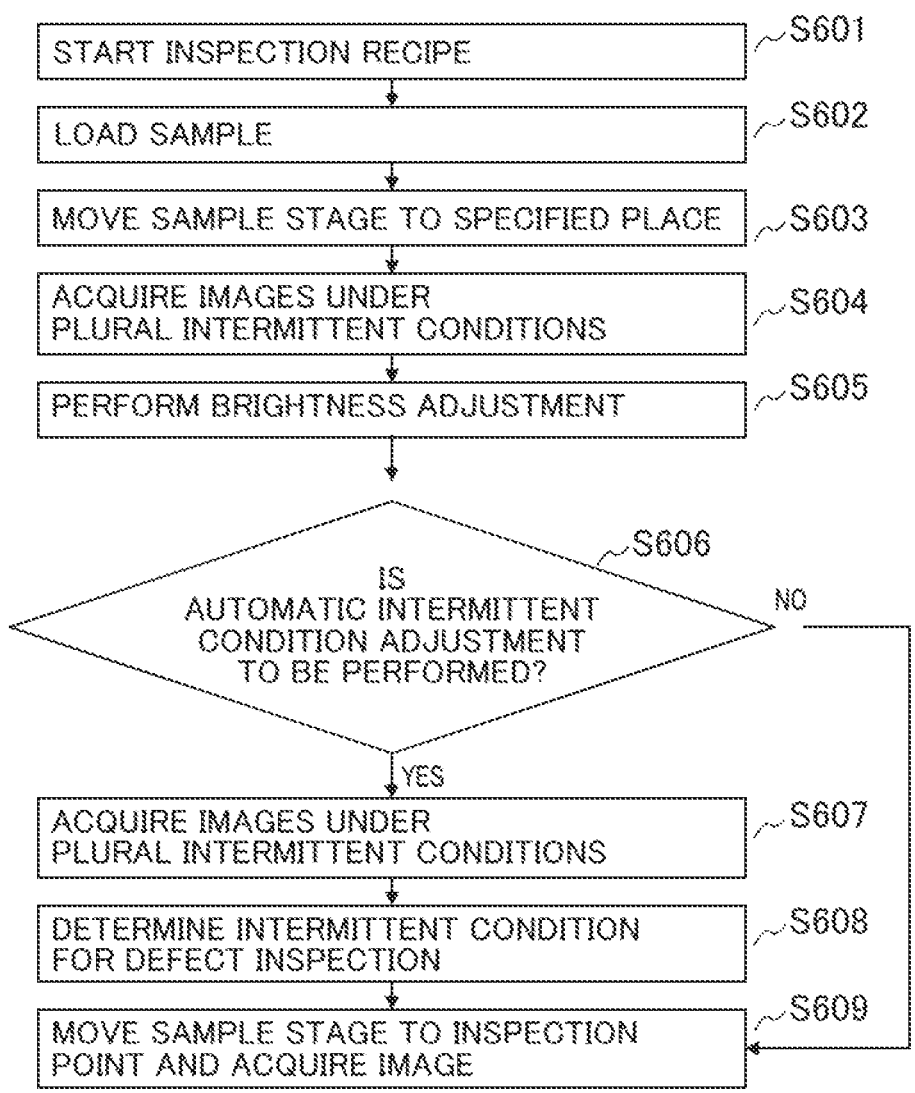
FIG. 30 is a flowchart which shows the process of automatically performing brightness adjustment using the images obtained under a plurality of intermittent conditions.

FIG. 30 shows a flowchart which shows the process of performing brightness adjustment automatically using the images acquired under a plurality of intermittent conditions. First, an inspection recipe is started (S601). The inspection recipe means a procedure to control a series of sequences to automatically perform processing before taking an image at an inspection point and acquire an image at the inspection point. Then, the sample is loaded on the scanning electron microscope (S602). Then, the sample stage is moved to a specified place (S603). Then, images are acquired under a plurality of intermittent conditions (S604). Then, brightness adjustment is performed using the images acquired under the plural intermittent conditions (S605).

The flow of brightness adjustment at S605 was the same as part of the flowchart shown in FIG. 2. In this embodiment, brightness adjustment was performed at a single position of the sample stage, but brightness adjustment may be performed at two or more positions of the sample stage. As an example of brightness adjustment at two or more positions of the sample stage, S603 to S605 in the flowchart may be carried out at each of one center point and one peripheral point of the sample so that the brightness adjustment value at either the center point or the peripheral point is used at the inspection point.

As another example of brightness adjustment at two or more positions of the sample stage, S603 to S605 in the flowchart may be carried out at each of two or more center points and two or more peripheral points of the sample so that the average of brightness adjustment values at all the points is used at the inspection point. Then, a decision is made as to whether or not to perform automatic intermittent condition adjustment (S606). If the adjustment is to be performed, the process goes to S607 and if not, the process goes to S609. If the automatic intermittent condition adjustment is performed, images are acquired under a plurality of intermittent conditions (S607). Then, the intermittent condition for defect inspection is determined (S608). The flow to determine the intermittent condition at S608 is the same as part of the flowchart shown in FIG. 19. Then, the sample stage is moved to a previously specified inspection point and an image is acquired using the previously specified intermittent condition or the intermittent condition determined at S608 (S609).

FIG. 31 shows the operation interface used in this embodiment. The operation interface in this embodiment is partially the same as the one in FIG. 3. The operation interface in this embodiment includes: a scanning speed setting field 56; a scanning area setting field 57; an irradiation setting field 58 for setting irradiation time or irradiation distance; an inter-irradiation point setting field 59 for setting interval time between irradiation points or distance between irradiation points; an automatic brightness adjustment selection field 111 for selecting whether to perform automatic brightness adjustment in an inspection recipe; an automatic intermittent condition adjustment selection field 112 for selecting whether to perform automatic intermittent condition adjustment in an inspection recipe; and an inspection status display field 113 for displaying the progress of inspection.

According to the above embodiment, for the inspection device which identifies a defective spot from brightness difference in a scanning electron microscope image, brightness adjustment can be automatically performed using the images acquired under a plurality of intermittent conditions.

LIST OF REFERENCE SIGNS

1 . . . electron beam source,
2 . . . acceleration voltage controller,
3 . . . focusing lens,
4 . . . pulsed electron generator,
5 . . . diaphragm,
6 . . . deflector,
7 . . . objective lens,
8 . . . sample electric field controller,
9 . . . detector,
10 . . . output adjusting circuit,
16 . . . sample stage,
17 . . . sample,
21 . . . acceleration voltage control section,
22 . . . irradiation current control section,
23 . . . pulse irradiation control section,
24 . . . deflection control section,
25 . . . focusing control section,
26 . . . sample electric field control section,
27 . . . gain control section,
28 . . . offset control section,
29 . . . stage position control section,
30 . . . control command section,
31 . . . analog-digital conversion control section,
32 . . . detection signal processing section,
33 . . . image forming section,
34 . . . image display section,
41 . . . operation interface,
51 . . . inspection pattern setting area,
52 . . . optical condition & scanning condition & intermittent condition setting area,
53 . . . irradiation voltage setting field,
54 . . . irradiation current setting field,
55 . . . sample electric field setting field,
56 . . . scanning speed setting field,
57 . . . scanning area setting field,
58 . . . irradiation setting field,
59 . . . inter-irradiation point setting field,
60 . . . brightness control area,
61 . . . manual/auto changeover field,
62 . . . gain input/display field,
63 . . . offset input/display field,
64 . . . brightness setting field,
65 . . . brightness difference setting field,
71 . . . silicon substrate,
72 . . . bottom insulating film,
73 . . . contact plug,
74 . . . interlayer insulating film,
81 . . . silicon substrate,
82 . . . impurity diffusion layer,
83 . . . contact plug,
84 . . . interlayer insulating film,
91 . . . silicon substrate,
92 . . . impurity diffusion layer,
93 . . . contact plug,
94 . . . interlayer insulating film,
101 . . . silicon carbide substrate,
102 . . . impurity diffusion layer,
103 . . . contact plug,
104 . . . interlayer insulating film,
111 . . . automatic brightness adjustment selection field,
112 . . . automatic intermittent condition adjustment selection field,
113 . . . inspection status display field

The invention claimed is:

1. A method for adjusting contrast and brightness of an image obtained by scanning a sample with a charged particle beam, comprising:
    performing offset adjustment of a signal processing device of a charged particle beam device so that brightness of a pattern in a first image obtained by scanning with a first charged particle beam becomes a predetermined value;
    performing gain adjustment of the signal processing device so that the brightness of a pattern in a second image obtained by scanning with a second charged particle beam, which is a pulse beam different from the first charged particle beam in at least one of irradiation time, irradiation distance, interval time between irradiation points, and distance between irradiation points, becomes a predetermined value; and
    adjusting the contrast and the brightness by performing the offset adjustment and the gain adjustment.

2. A method for adjusting contrast and brightness of an image obtained by scanning a sample with a charged particle beam to inspect a pattern included in the image, comprising the steps of:
    scanning the sample with a beam of a first condition;
    scanning the sample with a beam of a second condition different from the first condition;
    evaluating a characteristic of a first image obtained by scanning with the first condition beam;
    evaluating a characteristic of a second image obtained by scanning with the second condition beam;
    adjusting offset of a signal processing device of a charged particle beam device so that the characteristic of the first image becomes in a predetermined state; and
    adjusting a gain of the signal processing device so that a difference between the characteristic of the second image and the characteristic of the first image becomes in a predetermined state,
    wherein at least one of the first condition beam and the second condition beam is a pulse beam, and
    wherein the contrast and the brightness are adjusted by adjusting the signal processing device, and after adjusting the offset and adjusting the gain, a pattern included in a third image is inspected, the third image is obtained by scanning with a third charged particle beam that is a pulse beam.

3. The method according to claim 2,
    wherein the first condition beam and the second condition beam are different in a charging condition for a pattern formed in the sample.

4. The method according to claim 2,
    wherein the first condition beam and the second condition beam are pulse beams.

5. The method according to claim 4,
    wherein the first condition beam and the second condition beam are different in at least one of irradiation time, irradiation distance, interval time between irradiation points, and distance between irradiation points.

6. The method according to claim 2,
    wherein offset adjustment is performed so that the characteristic of the first image becomes in a predetermined state.

7. The method according to claim 2,
wherein gain adjustment is performed so that difference between the characteristic of the first image and the characteristic of the second image becomes in a predetermined state.

8. The method according to claim 2,
wherein offset adjustment is performed so that brightness of a pattern in the first image becomes a first predetermined value and gain adjustment is performed so that the brightness of a pattern in the second image becomes a second predetermined value.

9. A charged particle beam system comprising: a deflector structured to scan a charged particle beam emitted from a charged particle source; a signal processing device for processing a signal of detection of charged particles obtained by scanning a sample with the charged particle beam; and a controller,
wherein the controller is structured to
evaluate a characteristic of a first image obtained by scanning with a beam of a first condition and a characteristic of a second image obtained by scanning with a beam of a second condition different from the first condition,
adjust contrast and brightness of an image obtained by scanning the sample with the charged particle beam, by controlling the signal processing device so that the characteristic of the first image becomes in a predetermined state and a difference between the characteristic of the first image and the characteristic of the second image becomes in a predetermined state, and
after adjusting the offset and adjusting the gain, inspect a pattern included in a third image obtained by scanning with a third charged particle beam that is a pulse beam, and
wherein at least one of the first condition beam and the second condition beam is a pulse beam.

10. The charged particle beam system according to claim 9, comprising:
an operation interface to specify an inspection pattern from an image,
wherein the controller is structured to scan a sample area corresponding to the inspection pattern with the first condition beam and scan the sample area corresponding to the inspection pattern with the second condition beam.

11. The charged particle beam system according to claim 10,
wherein the first condition beam and the second condition beam are pulse beams.

12. The charged particle beam system according to claim 11,
wherein the first condition beam and the second condition beam are different in at least one of irradiation time, irradiation distance, interval time between irradiation points, and distance between irradiation points.

13. The charged particle beam system according to claim 9,
wherein the controller sets the first condition or the second condition according to change in the characteristic which is obtained when the first condition or the second condition is a plurality of conditions.

14. The charged particle beam system according to claim 13,
wherein the controller acquires the plurality of characteristics by changing at least one of time between irradiation points and distance between irradiation points for the beam and sets at least one of time between irradiation points and distance between irradiation points with which the change in the characteristic becomes in a predetermined condition.

15. The charged particle beam system according to claim 9,
wherein the controller controls the signal processing device according to a preset beam condition and a preset image characteristic or image characteristic range.

16. The charged particle beam system according to claim 9,
comprising an operation interface to set at least one of irradiation time, irradiation distance, interval time between irradiation points, and distance between irradiation points for the charged particle beam.

17. The charged particle beam system according to claim 9,
comprising an operation interface to set at least one of the characteristic of the first image and the characteristic of the second image.

18. The charged particle beam system according to claim 9,
wherein the controller performs offset adjustment so that the characteristic of the first image becomes in a predetermined state, and performs gain adjustment so that difference between the characteristic of the first image and the characteristic of the second image becomes in a predetermined state.

19. The method according to claim 1,
wherein the first charged particle beam is a pulse beam.

20. The method according to claim 8,
wherein scanning with the first condition beam and the offset adjustment are repeated so that the brightness of the pattern in the first image becomes a first predetermined value; and
wherein scanning with the second condition beam and the gain adjustment are repeated so that the brightness of the pattern in the second image becomes a second predetermined value.

* * * * *